(12) United States Patent
Gokan et al.

(10) Patent No.: US 11,430,721 B2
(45) Date of Patent: Aug. 30, 2022

(54) POWER MODULE

(71) Applicant: Mitsubishi Electric Corporation, Tokyo (JP)

(72) Inventors: Hiroshi Gokan, Tokyo (JP); Masaru Fuku, Tokyo (JP); Ryuichi Ishii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/158,331

(22) Filed: Jan. 26, 2021

(65) Prior Publication Data

US 2021/0384112 A1 Dec. 9, 2021

(30) Foreign Application Priority Data

Jun. 4, 2020 (JP) .............................. JP2020-097460

(51) Int. Cl.
*H01L 23/495* (2006.01)
*H01L 23/64* (2006.01)
*H01L 23/66* (2006.01)

(52) U.S. Cl.
CPC .. *H01L 23/49575* (2013.01); *H01L 23/49562* (2013.01); *H01L 23/642* (2013.01); *H01L 23/66* (2013.01)

(58) Field of Classification Search
CPC ......... H01L 23/49575; H01L 23/49562; H01L 23/642; H01L 23/66
See application file for complete search history.

(56) References Cited

U.S. PATENT DOCUMENTS

2020/0294872 A1* 9/2020 Kitawada ................ H01L 23/10
2020/0388556 A1* 12/2020 Tsuyuno ............. H01L 23/3121

FOREIGN PATENT DOCUMENTS

JP 2013-229383 A 11/2013

OTHER PUBLICATIONS

J. Lutz, et al., "Power Device-Induced Oscillations and Electromagnetic Disturbances", Semiconductor Power Device, DOI 10.1007/978-3-642-11125-9_13, 2011, pp. 475-495, Chapter13, Springer-Verlag Berlin Heidelberg.

* cited by examiner

*Primary Examiner* — Marc Anthony Armand
(74) *Attorney, Agent, or Firm* — Sughrue Mion, PLLC; Richard C. Turner

(57) ABSTRACT

Two semiconductor elements and a capacitive element are located at vertices of a triangle. A first shortest path between the semiconductor elements, and a second shortest path and a third shortest path between the capacitive element and the two respective semiconductor elements, satisfy (first shortest path)≥(second shortest path) and ((first shortest path)$^2$+ (second shortest path)$^2$)≥(third shortest path)$^2$. A first electrically conductive metal pattern and a second electrically conductive metal pattern each have a thickness that is equal to or larger than two times a depth of a skin through which current flows owing to skin effect generated according to frequency characteristics of current paths having: a first resonance frequency obtained from capacitances and inductances between the semiconductor elements; a second resonance frequency between one of the semiconductor elements and the capacitive element; and a third resonance frequency between another one of the semiconductor elements and the capacitive element.

8 Claims, 14 Drawing Sheets

$$f_r = \frac{c_0}{2L_e\sqrt{\varepsilon_r}}$$

$$f_{T\_PETT} = \frac{3}{4}\frac{v_{sat,p}}{W_{SC}}$$

$$f_{T\_IMPATT} = \frac{1}{2}\frac{v_{sat,n}}{W_{SC}}$$

POWER MODULE

BACKGROUND OF THE INVENTION

1. Field of the Invention

The present disclosure relates to a power module.

2. Description of the Background Art

Power modules obtained by incorporating and modularizing power semiconductor elements may be used for power conversion devices and the like. The power semiconductor elements include MOSFETs (Metal Oxide Semiconductor Field Effect Transistors), IGBTs (Insulated Gate Bipolar Transistors), diodes, and the like. Phenomena have been known in which oscillations occur when two or more power semiconductor elements are connected and driven in parallel. The phenomena involving the oscillations include: phenomena caused by LC resonance due to the parasitic inductance and the parasitic capacitance of a gate signal line or an emitter signal line; phenomena caused by the difference, among switching timings at the time of turn-on/off, that is based on the difference in gate threshold voltage among the elements being driven in parallel; phenomena caused by a difference, in current, that is based on a busbar layout among elements or a variation among the elements; and the like.

Besides, phenomena involving an oscillation at a frequency that is higher than the frequencies of these oscillations include PETT (Plasma Extraction Transit Time Oscillation) and IMPATT (Impact Ionization Avalanche Transit Time Oscillation) (see, for example, Non-Patent Document 1). FIG. 12 is a diagram in which, regarding a bipolar power semiconductor element, an example of distributions of frequencies of PETT with respect to operation voltage is shown with temperature being a parameter on the basis of the expression indicated in the drawing. The bipolar power semiconductor element refers to an IGBT, a p-n junction diode, a reverse conducting IGBT, or the like. Meanwhile, FIG. 13 is a diagram in which, regarding a power semiconductor element, an example of distributions of frequencies of IMPATT with respect to operation voltage is shown with temperature being a parameter on the basis of the expression indicated in the drawing. The power semiconductor element refers to an IGBT, a MOSFET, a p-n junction diode, a Schottky junction diode, a reverse conducting IGBT, or the like. In the expressions indicated in FIG. 12 and FIG. 13, each numerator indicates a saturation velocity that is dependent on the temperatures, the types, and the physical properties of carriers of the semiconductor, and each denominator indicates a depletion layer thickness that is dependent on an impurity concentration, a voltage, and a physical property permittivity. In an application with a large operation voltage width and a wide operation temperature region, the frequencies of PETT and IMPATT are widely distributed with respect to operation voltage and temperature. FIG. 12 and FIG. 13 each show an example that indicates the possibility of occurrence of oscillations. In a case where a power module is formed by coupling an IGBT and a p-n junction diode, since there is a difference in impurity concentration between the IGBT and the diode, the distributions of the frequencies of PETT and IMPATT are shifted from the distributions shown in FIG. 12 and FIG. 13, and the frequencies are more widely distributed. A requirement for occurrence of a local breakdown limit value electric field (local avalanche) in a depletion layer is associated with IMPATT. However, even if the voltage is low, IMPATT falls within an occurrence condition region when the current is high, and meanwhile, even if the current is low, IMPATT falls within the occurrence condition region when the voltage is high, and thus it can still be said that the frequencies are distributed over a wide range.

Occurrence of strong oscillations due to PETT and IMPATT may induce: a malfunction of a drive circuit due to transmission of the oscillations to a gate signal line or a ground line; breakage of a power semiconductor element due to induction of vibrations to a gate signal; a low-voltage operation LSI malfunction that occurs when the oscillations are radiated to be transmitted through a space to a control board mounted with a microcomputer, a power supply IC, a drive circuit for a power semiconductor element, and the like so that vibrations are superimposed on a signal or the ground line; or the like. Thus, demand for suppressing occurrence of PETT and IMPATT in power modules has been intensified in recent years. In view of this, a method has been disclosed in which PETT is suppressed by correcting layouts of a lead frame and wire bonding such that an LC resonance frequency determined according to the parasitic capacitance of a power semiconductor element and the parasitic inductances of the lead frame and the wire bonding does not match a frequency determined according to a time that holes (positive holes, minority-side carriers) take to pass through a depletion layer when an IGBT or a p-n junction diode is OFF (see, for example, Patent Document 1). FIG. 14 is a diagram showing an example of distributions of frequencies of PETT and LC resonance in upper-limit-side and lower-limit-side limit designs for a parasitic inductance in a case where the design of the lead frame is corrected.

Patent Document 1: Japanese Laid-Open Patent Publication No. 2013-229383

Non-Patent Document 1: J. Lutz et al., Semiconductor Power Device, DOI 10.1007/978-3-642-11125-9_13, page 475 to 495

In the above-described Patent Document 1, PETT can be suppressed within only a range based on a partial limited condition as shown in FIG. 14. However, the following problem arises. Although the parasitic capacitance takes a numeral that is fixed by determining a semiconductor element, suppression of vibrations caused by PETT and IMPATT in a design of a module mounted with a power semiconductor element deviating from the distributions of the frequencies of PETT and IMPATT is difficult to be addressed by only the correction of the layouts of the lead frame and the wire bonding with respect to the arrangement and the configuration of a power semiconductor element determined according to heat dissipation performance and insulation performance.

SUMMARY OF THE INVENTION

Considering this, an object of the present disclosure is to obtain a power module in which vibrations caused by PETT and IMPATT are suppressed.

A power module according to the present disclosure is a power module including: two semiconductor elements each of which has an electrode on each of a one-side surface and an other-side surface of the semiconductor element; a flat-plate-shaped first electrically conductive metal pattern connected to the electrode on the one-side surface of each of the two semiconductor elements arranged on a same plane; a flat-plate-shaped second electrically conductive metal pattern connected to the electrode on the other-side surface of each of the two semiconductor elements; and a capacitive element disposed, on the same plane, between the first electrically conductive metal pattern and the second electrically conductive metal pattern and forming a capacitance between the first electrically conductive metal pattern and the second electrically conductive metal pattern. The two semiconductor elements and the capacitive element are located at vertices of a triangle on the same plane. The first and second electrically conductive metal patterns are each characterized by having a flat-plate shape with a contour within which the three vertices and three sides of the triangle are included. If a shortest connection length path between the two semiconductor elements on the first electrically conductive metal pattern and the second electrically conductive metal pattern, is defined as a first shortest path, and a shorter path and a longer path out of two shortest connection length paths between the capacitive element and the two respective semiconductor elements on the first electrically conductive metal pattern and the second electrically conductive metal pattern, are respectively defined as a second shortest path and a third shortest path, (first shortest path)≥(second shortest path) and ((first shortest path)$^2$+(second shortest path)$^2$)≥(third shortest path)$^2$ are satisfied. If a resonance frequency obtained from two capacitances parasitic between the one-side surfaces and the other-side surfaces of the two semiconductor elements and two inductances generated between the one-side surfaces and between the other-side surfaces of the two semiconductor elements on the first electrically conductive metal pattern and the second electrically conductive metal pattern, is defined as a first resonance frequency, a resonance frequency obtained from a capacitance generated by the capacitive element and a capacitance parasitic between the one-side surface and the other-side surface of one of the two semiconductor elements and two inductances generated between the capacitive element and the one-side surface of the one of the semiconductor elements and between the capacitive element and the other-side surface of the one of the semiconductor elements on the first electrically conductive metal pattern and the second electrically conductive metal pattern, is defined as a second resonance frequency, and a resonance frequency obtained from a capacitance generated by the capacitive element and a capacitance parasitic between the one-side surface and the other-side surface of another one of the two semiconductor elements and two inductances generated between the capacitive element and the one-side surface of the other one of the semiconductor elements and between the capacitive element and the other-side surface of the other one of the semiconductor elements on the first electrically conductive metal pattern and the second electrically conductive metal pattern, is defined as a third resonance frequency, the first electrically conductive metal pattern and the second electrically conductive metal pattern each have a thickness that is equal to or larger than two times a depth of a skin through which current flows owing to skin effect generated by the first resonance frequency, the second resonance frequency, and the third resonance frequency of current paths, and the first electrically conductive metal pattern, the second electrically conductive metal pattern, and the capacitive element reduce vibrations caused by any of the first resonance frequency, the second resonance frequency, and the third resonance frequency of the current paths each of which is present between two elements arbitrarily selected from among the two semiconductor elements and the capacitive element.

The power module according to the present disclosure is as follows. The two semiconductor elements and the capacitive element are located at the vertices of the triangle between the flat-plate-shaped first electrically conductive metal pattern and the flat-plate-shaped second electrically conductive metal pattern. The electrically conductive metal patterns are formed so as to include the triangle within the contours thereof. If a shortest connection length path between the two semiconductor elements on the first electrically conductive metal pattern and the second electrically conductive metal pattern, is defined as a first shortest path, and a shorter path and a longer path out of two shortest connection length paths between the capacitive element and the two respective semiconductor elements on the first electrically conductive metal pattern and the second electrically conductive metal pattern, are respectively defined as a second shortest path and a third shortest path, (first shortest path)≥(second shortest path) and ((first shortest path)$^2$+(second shortest path)$^2$)≥(third shortest path)$^2$ are satisfied. The first electrically conductive metal pattern and the second electrically conductive metal pattern each have a thickness that is equal to or larger than two times the depth of the skin through which current flows owing to skin effect generated according to frequency characteristics of current paths with the first resonance frequency, the second resonance frequency, and the third resonance frequency each of which is obtained from capacitance(s) and inductances. The capacitance(s) are formed mutually between two elements selected from among three elements which are the capacitive element and capacitances parasitic between one-side electrodes and other-side electrodes of the two semiconductor elements. The inductances are extracted between the electrodes of the presently selected two elements. Elements are selected in three ways. That is, two elements that are connected to any of the first to third shortest paths are selected from among the three elements. Accordingly, the following advantageous effect is obtained regarding current vibrations that occur when the semiconductor elements are switched on or off. Regarding vibrations caused by any of the first, second, and third resonance frequencies of the current paths each of which is present between two elements arbitrarily selected from among the two semiconductor elements and the capacitive element, the first electrically conductive metal pattern, the second electrically conductive metal pattern, and the capacitive element prevent current of the vibrations from being concentrated on a part of the paths on a lead frame 1 and a lead frame 2. In addition, the following advantageous effect is also obtained regarding vibration currents caused by PETT and IMPATT falling within the same frequency region. For example, the vibration currents are prevented from being concentrated on a part of the paths at any of the first, second, and third resonance frequencies, whereby vibrations caused by PETT and IMPATT can be suppressed.

DETAILED DESCRIPTION OF THE PREFERRED EMBODIMENTS OF THE INVENTION

Figure 1:
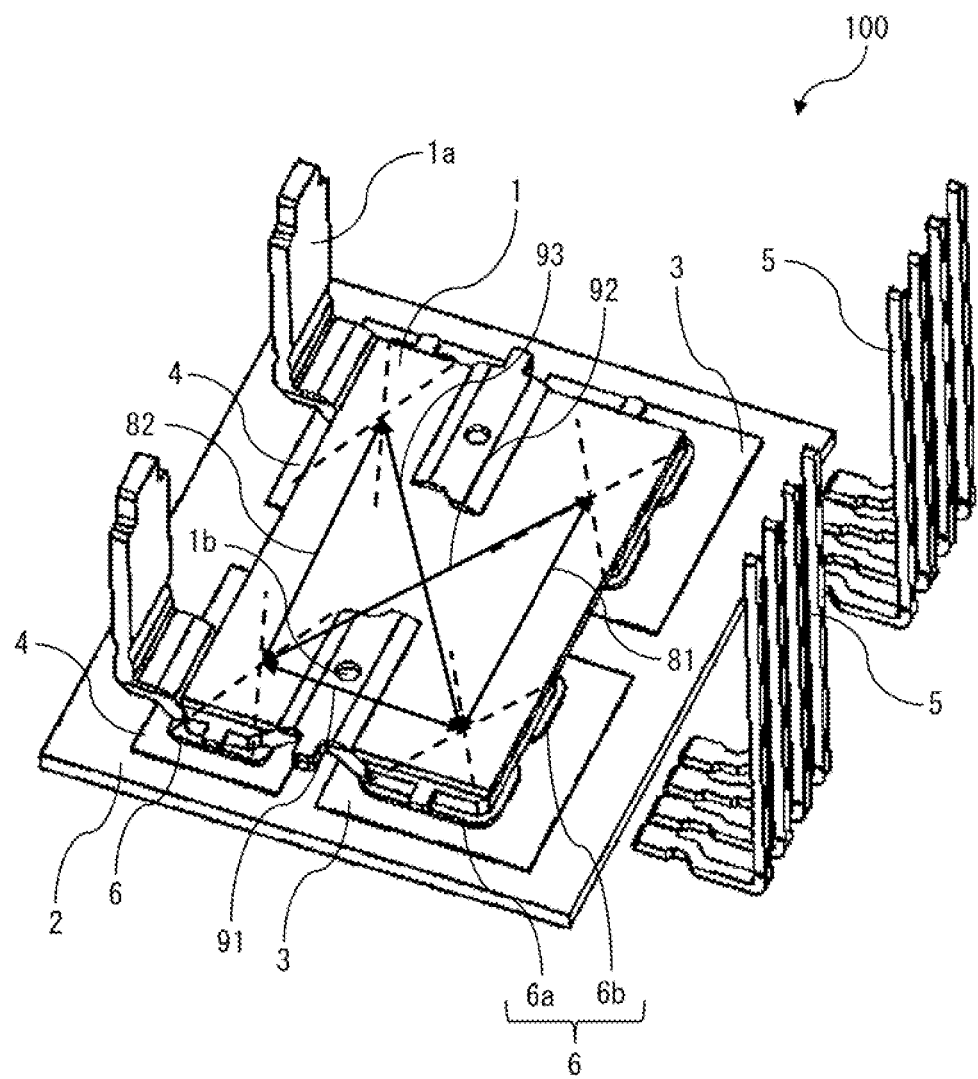
FIG. 1 is a perspective view schematically showing major parts of a power module according to a first embodiment.

Hereinafter, power modules according to embodiments of the present disclosure will be described with reference to the drawings. Description will be given while the same or corresponding members and portions in the drawings are denoted by the same reference characters.

First Embodiment

Figure 2:
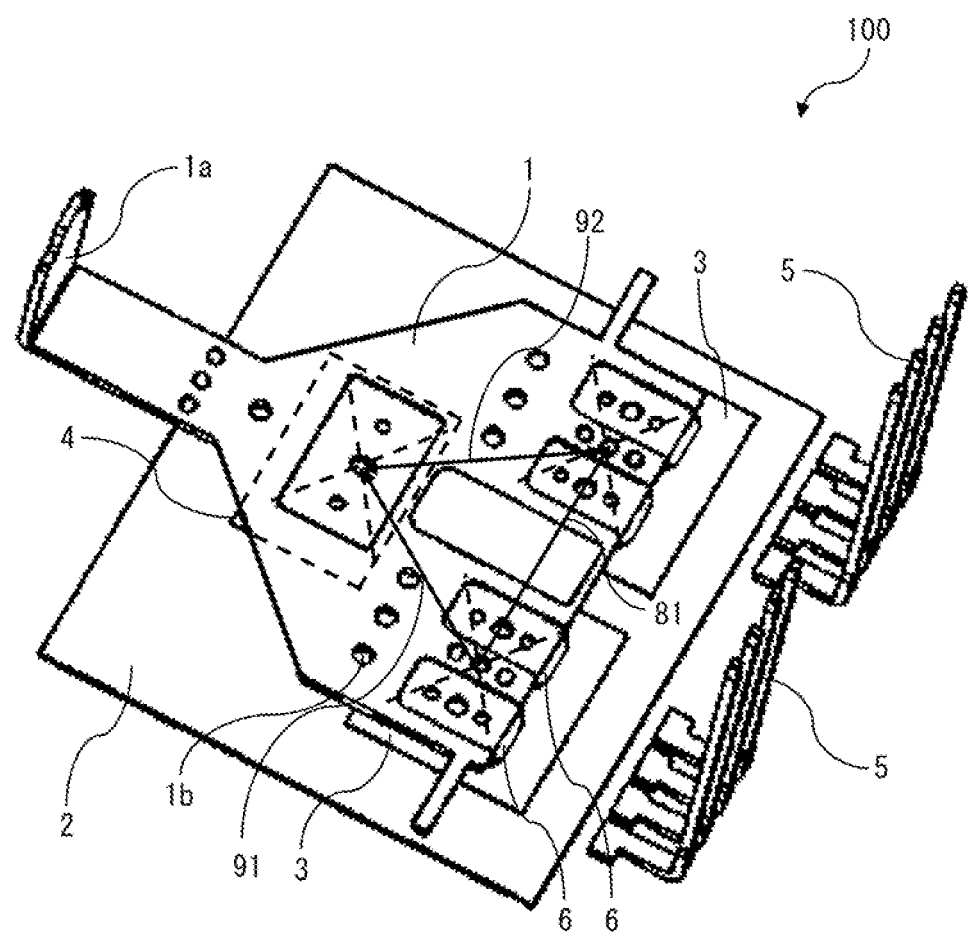
FIG. 2 is a perspective view schematically showing major parts of another power module according to the first embodiment.
Figure 3:
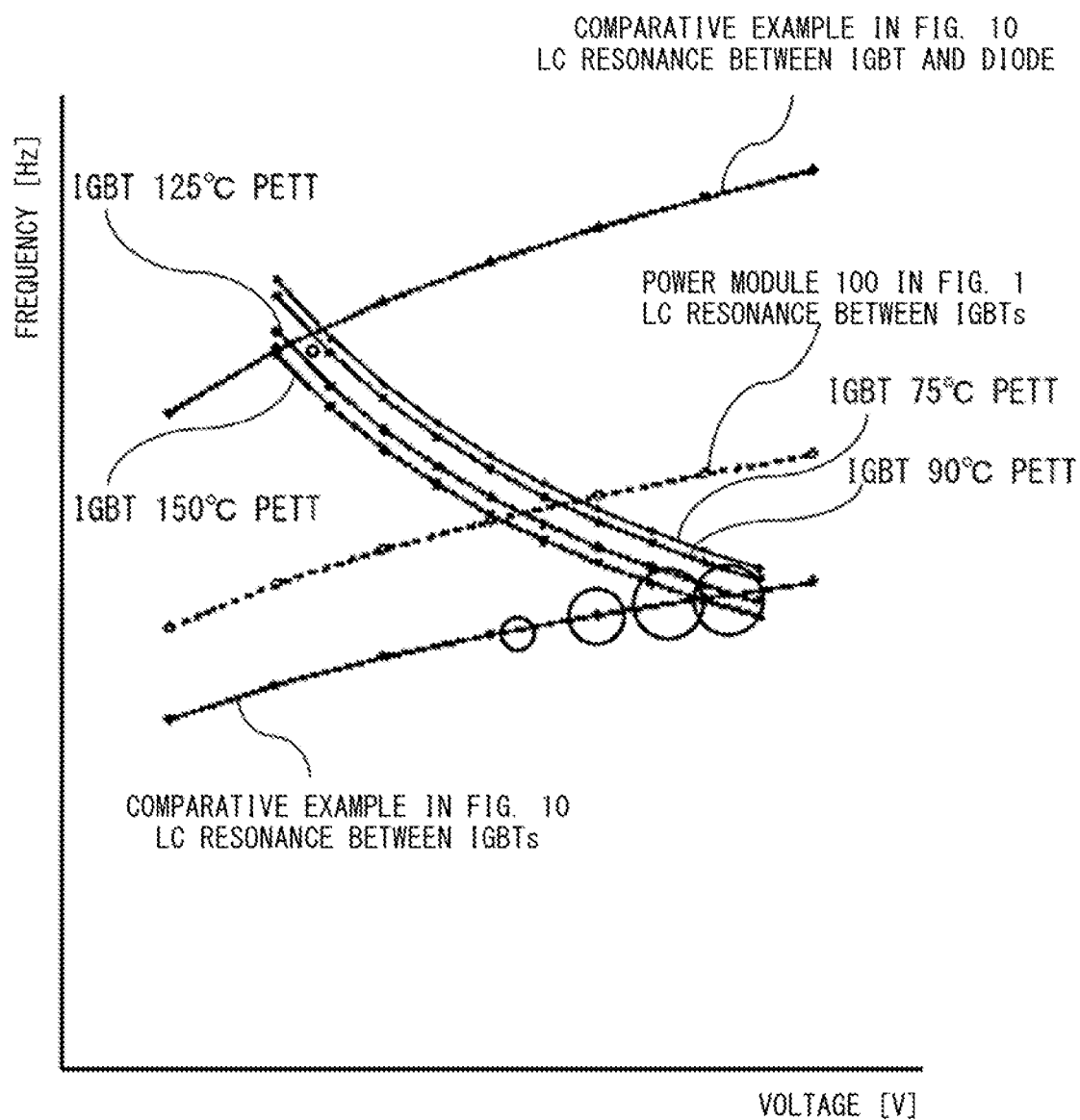
FIG. 3 is a diagram showing an example of distributions of frequencies of LC resonance and PETT with respect to operation voltage, in the power module according to the first embodiment.
Figure 4:
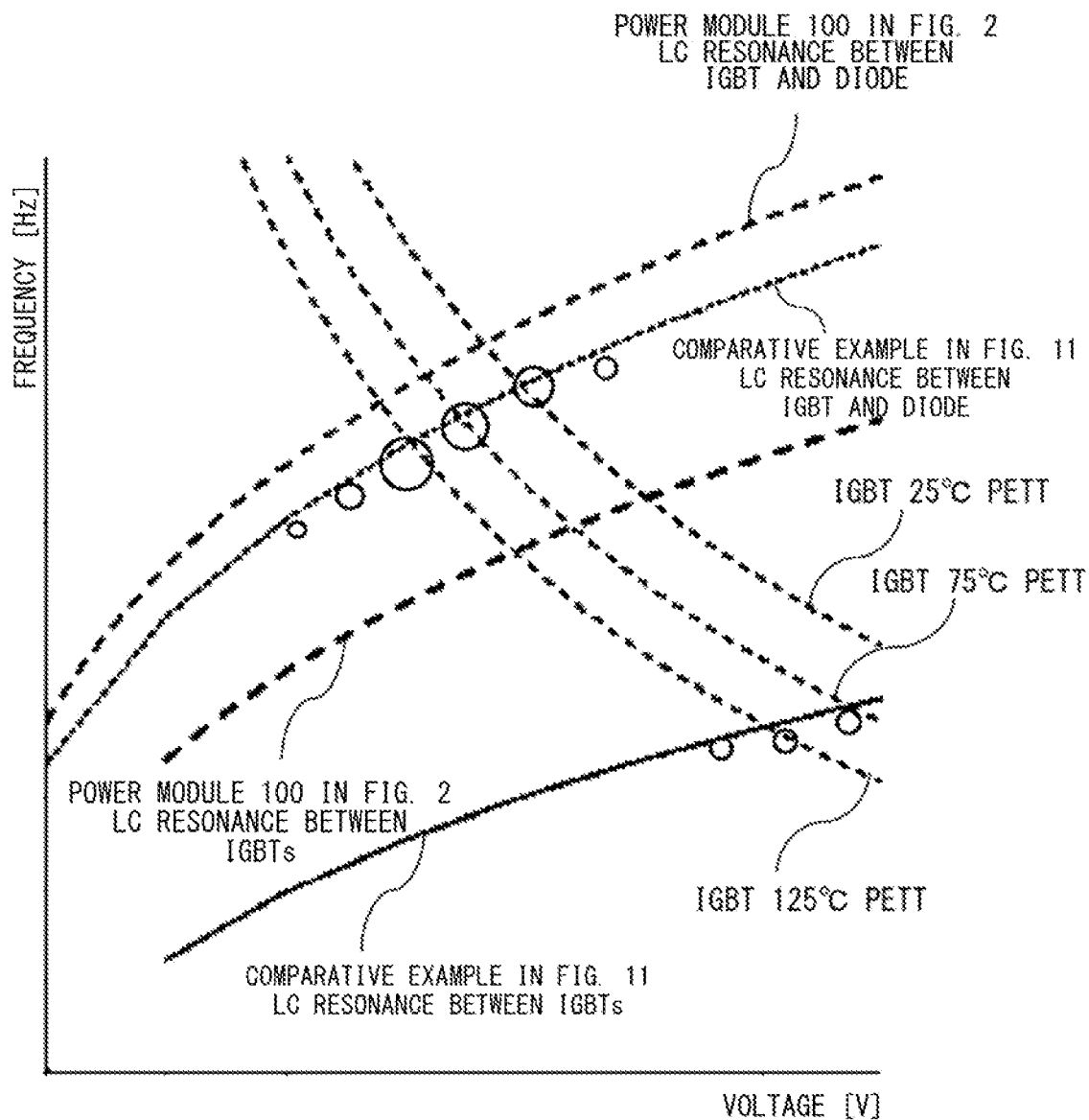
FIG. 4 is a diagram showing an example of distributions of frequencies of LC resonance and PETT with respect to operation voltage, in the other power module according to the first embodiment.

FIG. 1 is a perspective view schematically showing major parts of a power module 100 according to a first embodiment. FIG. 2 is a perspective view schematically showing major parts of another power module 100. FIG. 3 is a diagram showing an example of distributions of frequencies of LC resonance and PETT with respect to operation voltage, in the power module 100. FIG. 4 is a diagram showing an example of distributions of frequencies of LC resonance and PETT with respect to operation voltage, in the other power module 100. FIG. 1 and FIG. 2 are views of the power modules 100 from which insulation fillers enclosing semiconductor elements 3 and the like inside have been removed. Each insulation filler is, for example, a mold resin and may be a gel. The gel is disposed around the semiconductor elements and between elements. Resin is disposed on the outermost side. Each power module 100 is a module mounted with two semiconductor elements 3 and constitutes, for example, an inverter circuit in an inverter device.

<Power Module 100>

As shown in FIG. 1, the power module 100 includes the two semiconductor elements 3, two capacitive elements 4, a lead frame 1 which is a first electrically conductive metal pattern, a lead frame 2 which is a second electrically conductive metal pattern, and lead frames 5. Each semiconductor element 3 has an electrode 6 on each of a one-side surface and an other-side surface thereof. The electrode 6 on the one-side surface is an upper surface electrode and an N-electrode, and the electrode on the other-side surface (not shown) is a lower surface electrode and a P-electrode. The number of electrodes 6 on each surface is not limited to one, and an electrode 6 may be divided. In the present first embodiment, each electrode 6 is divided into two electrodes 6a and 6b. The two semiconductor elements 3 and the two capacitive elements 4 are arranged on the same plane. The lead frame 1 has the shape of a flat plate and is connected to the upper surface electrode of each of the two semiconductor elements 3. The lead frame 1 includes terminal portions 1a connected to another circuit (not shown). The lead frame 2 has the shape of a flat plate and is connected to the lower surface electrode of each of the two semiconductor elements 3. The lead frame 1 and the lead frame 2 are made of, for example, copper. The lead frame 2 is disposed on a DBC (Direct Bonded Copper) substrate or an insulative resin which are not shown.

The two capacitive elements 4 are disposed between the lead frame 1 and the lead frame 2 and form capacitances between the lead frame 1 and the lead frame 2. The two semiconductor elements 3 and the two capacitive elements 4 are connected in parallel between the lead frame 1 and the lead frame 2. The two semiconductor elements 3 and the two capacitive elements 4 are connected to the lead frame 1 and the lead frame 2 by means of a solder, an electrically conductive paste, or an electrically conductive adhesive material. The lead frame 1 and the lead frame 2 are, at the same potential, connected to each of the two semiconductor elements 3 and the two capacitive elements 4. The lead frames 5 are connected to the semiconductor elements 3 by means of bonding wires (not shown). Each lead frame 5 is a terminal connected to the other circuit (not shown) and is supported by the insulation filler. The other circuit connected to the terminal portions 1a and the lead frames 5 is, for example, a drive circuit for driving the power module 100.

The two semiconductor elements 3 and one or the other one of the two capacitive elements 4 are located at the vertices of a triangle on the same plane. In a case where the two semiconductor elements 3 are connected and driven in parallel, oscillations occur owing to resonance due to parasitic inductances and parasitic capacitances between the two semiconductor elements 3. In a case where the two semiconductor elements 3 are of the same type and has the same size and the same characteristics, stronger oscillations occur. In order to suppress the oscillations, the capacitive elements 4 are disposed such that the two semiconductor elements 3 and each capacitive element 4 are located at the vertices of a triangle. Hereinafter, description will be given while the sides where the two semiconductor elements 3 are present are regarded as the sources of vibrations. However, the side where the capacitive element 4 is present may be regarded as the source of vibrations.

The locations of the vertices of the triangle are arranged as follows. That is, if a shortest connection length path between the two semiconductor elements 3 on the lead frame 1 and the lead frame 2, is defined as a first shortest path, and a shorter path and a longer path out of two shortest connection length paths between the capacitive element 4 and the two respective semiconductor elements 3 on the lead frame 1 and the lead frame 2, are respectively defined as a second shortest path and a third shortest path, the relationships of (first shortest path)≥(second shortest path) and ((first shortest path)$^2$+(second shortest path)$^2$)≥(third shortest path)$^2$ are satisfied. The former one of the expressions is defined as a first expression, and the latter one of the expressions is defined as a second expression. If the two shortest connection length paths between the capacitive element 4 and the two respective semiconductor elements 3 have the same length, either shortest connection length path may be defined as the second shortest path or the third shortest path. The distance between the centers of the electrodes on the upper surfaces or the lower surfaces of two elements is defined as the distance between the elements. If division electrodes are present, the center of an electrode obtained by combining the division electrodes is defined as the center of the electrodes. Intersection points of broken lines shown in FIG. 1 and FIG. 2 are located at the centers of the electrodes. If the shape of an electrode is different between the upper surface and the lower surface, the distance is different between the upper surface and the lower surface. Also in this case, the relationships of the first expression and the second expression need to be satisfied at both the upper surface and the lower surface. If the sides where the semiconductor elements 3 are present in FIG. 1 are defined as the sources of vibrations, the first expression is (first shortest path 81)≥(second shortest path 91) and the second expression is ((first shortest path 81)$^2$+(second shortest path 91)$^2$)≥(third shortest path 92)$^2$. If the sides where the capacitive elements 4 are present in FIG. 1 are defined as the sources of vibrations, the first expression is (first shortest path 82)(second shortest path 91) and the second expression is ((first shortest path 82)$^2$+(second shortest path 91)$^2$)(third shortest path 93)$^2$. If the sides where the semiconductor elements 3 are present in FIG. 2 are defined as the sources of vibrations, the first expression is (first shortest path 81)≥(second shortest path 91) and the second expression is ((first shortest path 81)$^2$+(second shortest path 91)$^2$) ≥(third shortest path 92)$^2$.

An example in which the two capacitive elements 4 are provided has been shown in FIG. 1. However, as shown in FIG. 2, the number of capacitive elements 4 may be one. In this case, the two semiconductor elements 3 and the one capacitive element 4 are located at the vertices of a triangle on the same plane. Each semiconductor element 3 is a power semiconductor element such as a MOSFET (Metal Oxide Semiconductor Field Effect Transistor) or an IGBT (Insulated Gate Bipolar Transistor), for example. The two semiconductor elements 3 may be IGBTs or bipolar transistors, and the capacitive elements 4 may be p-n junction diodes or Schottky junction diodes. In FIG. 1 and FIG. 2, the semiconductor elements 3 are IGBTs, and the capacitive elements 4 are p-n junction diodes. The arrangement of the capacitive elements 4 and the two semiconductor elements 3 in FIGS. 1-2 indicates a physical geometry; a physical geometry is associated with positions and distances. The placement of the capacitive elements 4 (which may be a single capacitive element 4 as shown in FIG. 2) is a geometric placement configured to reduce vibration.

Figure 12:
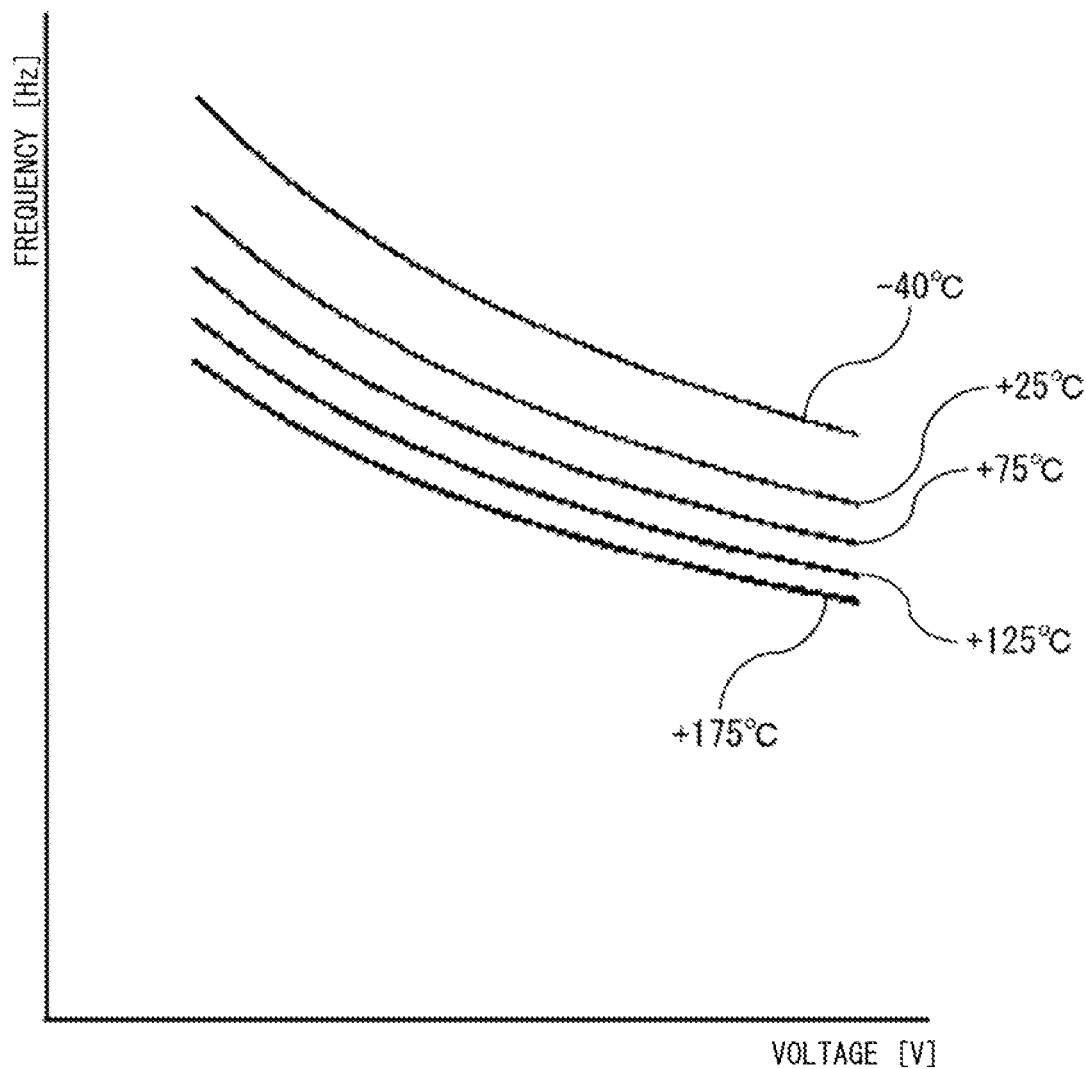
FIG. 12 is a diagram showing an example of distributions of frequencies of PETT with respect to operation voltage.
Figure 13:
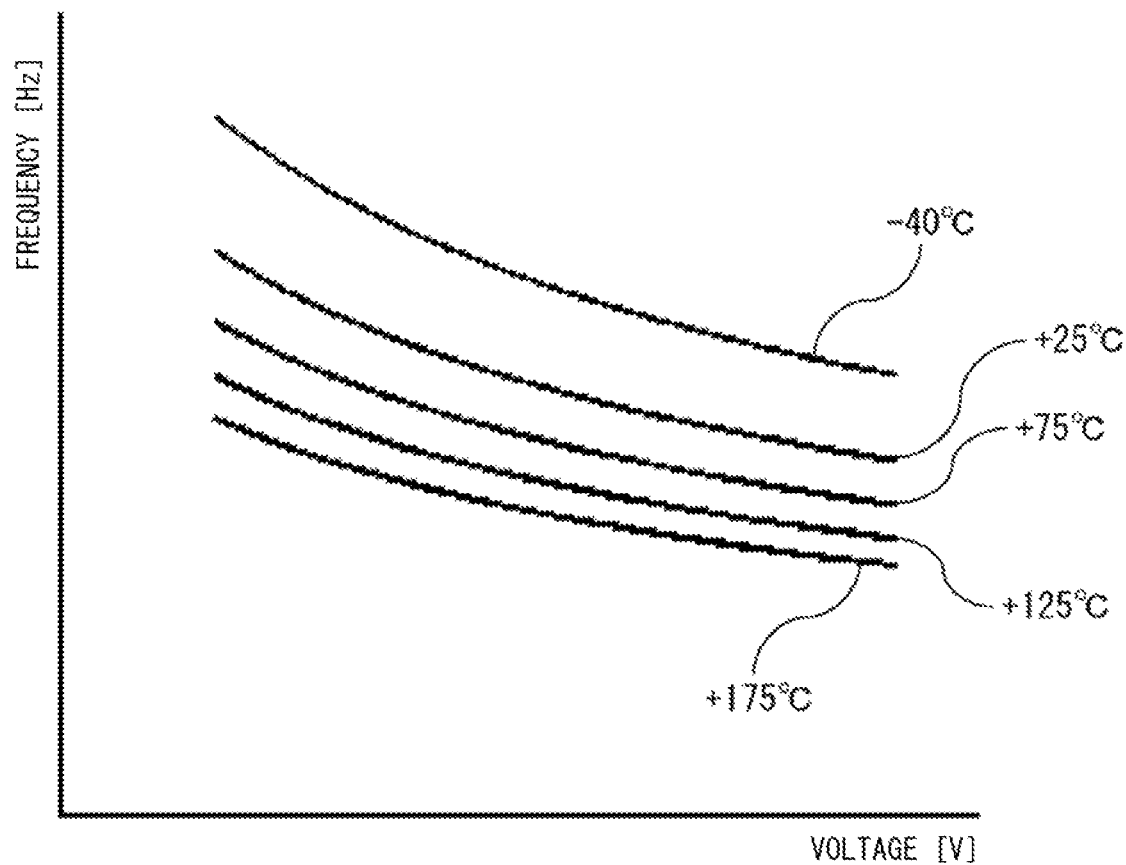
FIG. 13 is a diagram showing an example of distributions of frequencies of IMPATT with respect to operation voltage.

PETT and IMPATT are phenomena in which oscillations occur at relatively high frequencies. PETT and IMPATT occur even with a single power semiconductor element, and, when a plurality of elements having the same size and the same characteristics are connected and operated in parallel, particularly strong oscillations may occur owing to a slight difference among switching timings due to a variation among, for example, device threshold values such as gate threshold values Vth. The phenomenon involving strong oscillations occur by: the start of occurrence of PETT or IMPATT frequencies shifting in the PETT or IMPATT frequency distributions that are intrinsic to semiconductor elements and are shown in FIG. 12 or FIG. 13, to cause a phase shift of the same frequency so that a vibration current that is intrinsic to elements connected in parallel is generated between the elements; and an LC resonance frequency approximating to or matching the vibration current, the LC resonance frequency being based on a parasitic inductance at a path through which the vibration current passes and parasitic capacitances of the elements connected in parallel. Hereinafter, description will be given, focusing on a case where PETT occurs when an IGBT is turned off. The same description can apply also to: a case where PETT occurs at the time of reverse recovery of a p-n junction diode; a case where IMPATT occurs when a MOSFET or an IGBT is turned off; and a case where PETT occurs at the time of reverse recovery of a p-n junction diode or a Schottky junction diode.

Comparative Example

Figure 10A:
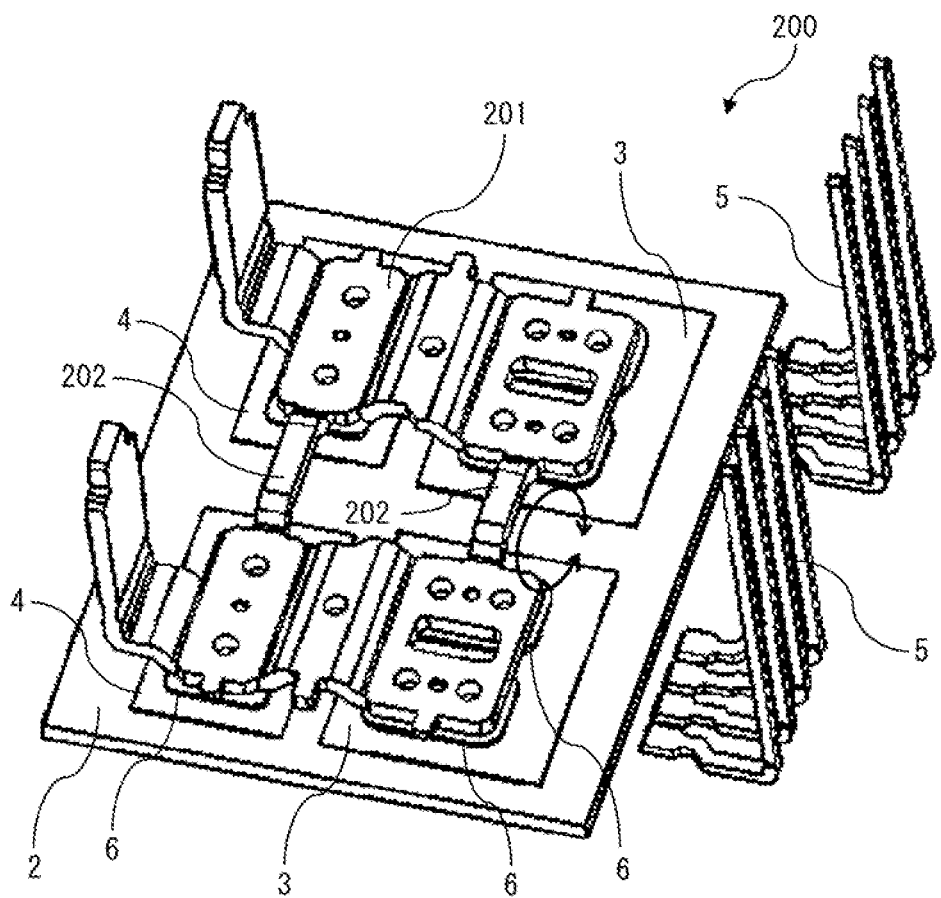
FIG. 10A is a perspective view schematically showing major parts of the power module of a comparative example.
Figure 10B:
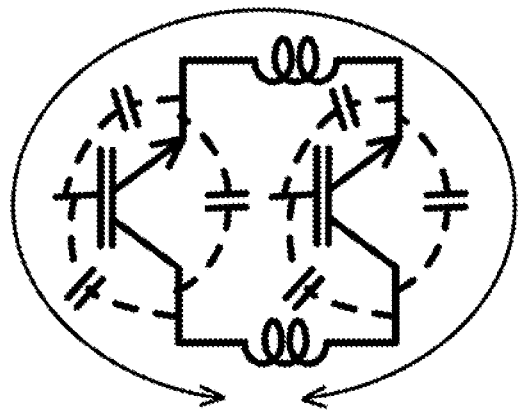
FIG. 10B is a diagram showing a circuit composed of two semiconductor elements in FIG. 10A.
Figure 11A:
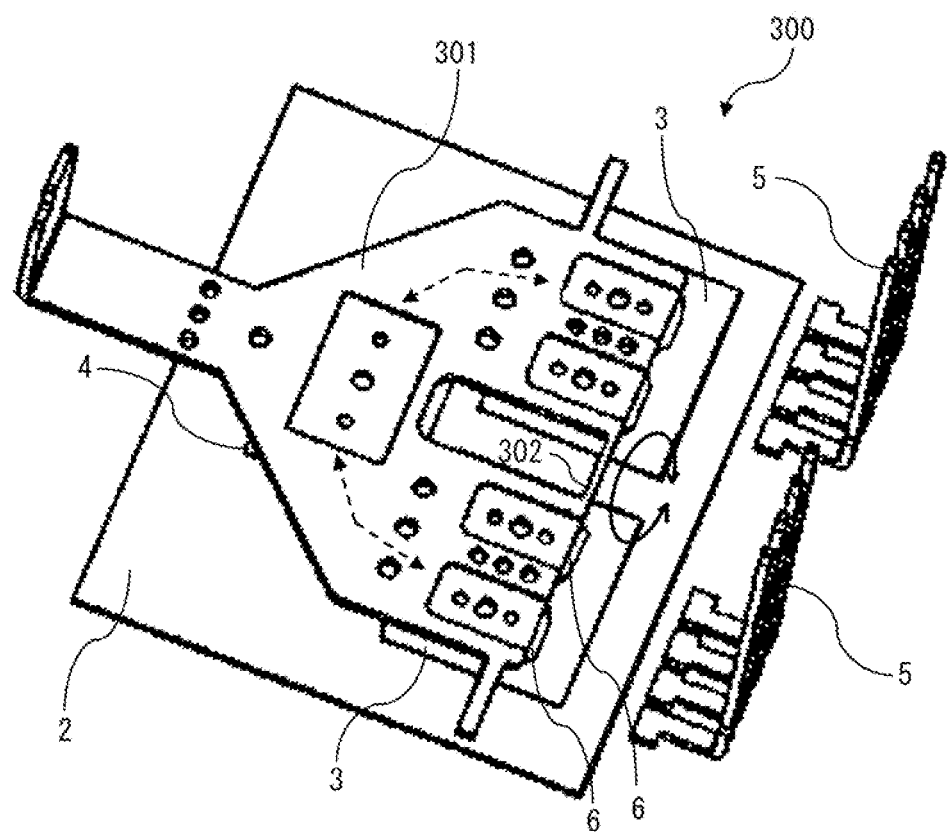
FIG. 11A is a perspective view schematically showing major parts of the other power module of a comparative example.
Figure 11B:
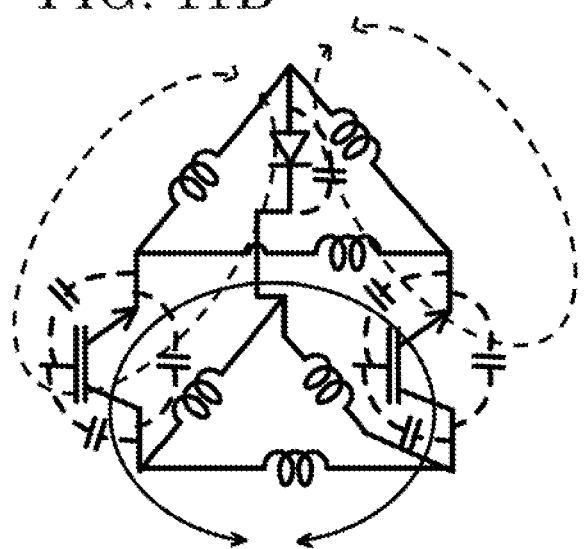
FIG. 11B is a diagram showing a circuit in FIG. 11A.

A comparative example will be described with reference to FIG. 10 and FIG. 11 before the lead frames 1 and 2 which are major parts of the present disclosure are described. FIG. 10 illustrates a power module 200 of a comparative example, FIG. 10A is a perspective view schematically showing major parts of the power module 200, and FIG. 10B is a diagram showing a circuit composed of two semiconductor elements 3 in FIG. 10A. FIG. 11 illustrates another power module 300 of the comparative example, FIG. 11A is a perspective view schematically showing major parts of the other power module 300, and FIG. 11B is a diagram showing a circuit in FIG. 11A. As shown in FIG. 10A, a lead frame 201 of the power module 200 does not have the shape of a flat plate, and connections are made between the two semiconductor elements 3 and between two capacitive elements 4 by bridging portions 202 which have been machined so as to be thin. No direct connection is made between the semiconductor elements 3 and the capacitive elements 4 apart from each other in diagonal directions. As shown in FIG. 11A, a lead frame 301 of the power module 300 does not have the shape of a flat plate, and a connection is made between two semiconductor elements 3 by a bridging portion 302 which has been machined so as to be thin. In FIG. 10 and FIG. 11, the semiconductor elements 3 are IGBTs, and the capacitive elements 4 are p-n junction diodes.

Figure 14:
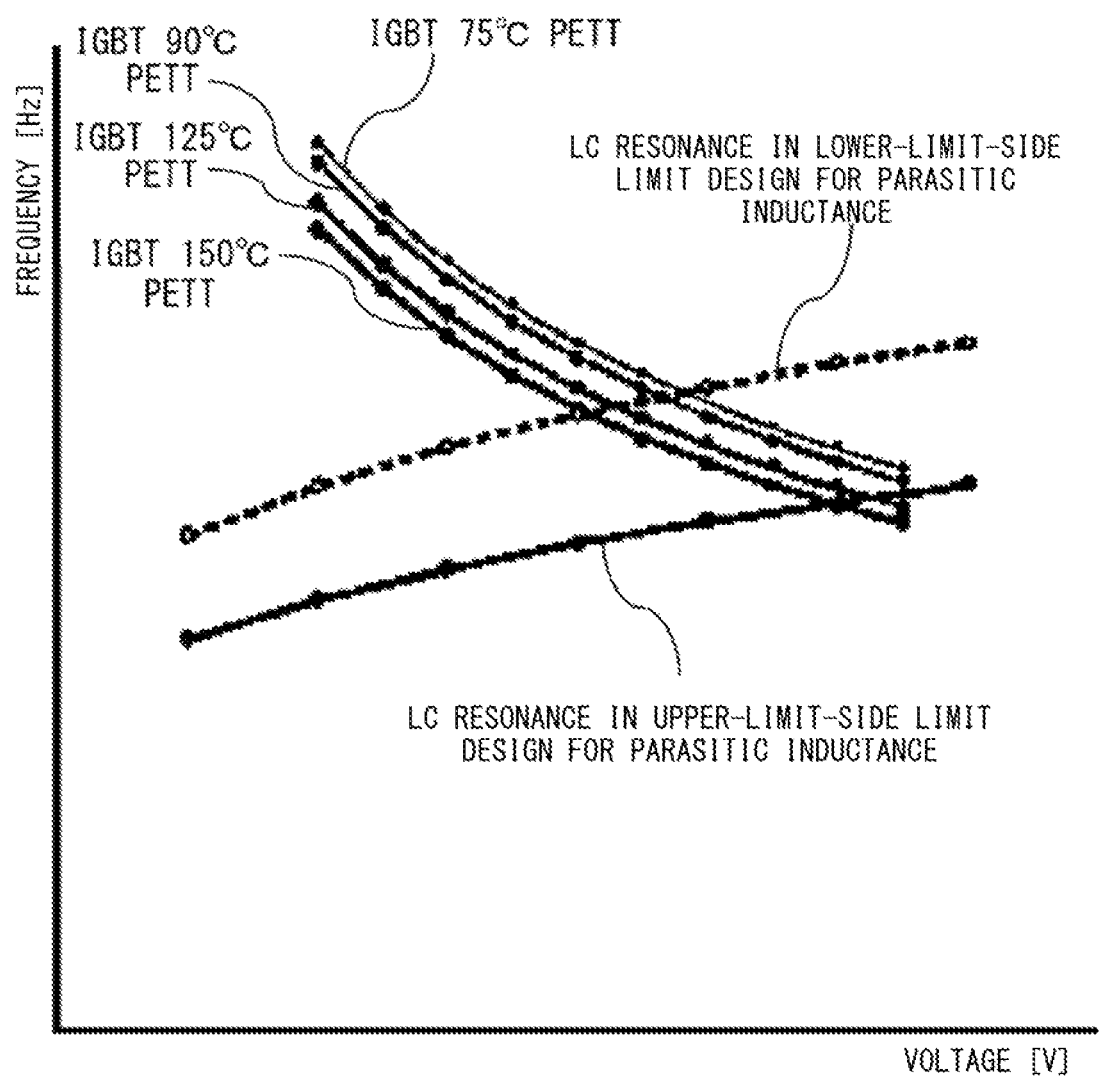
FIG. 14 is a diagram showing an example of distributions of frequencies of LC resonance and PETT at an upper limit and a lower limit of a parasitic inductance.

PETT will be considered in relation to an operable region required for products, and a wide operation voltage and temperature region. Even if a condition of an upper-limit-side or lower-limit-side limit design is applied to the design of the lead frames, it is ordinary that one or more PETT and IMPATT frequencies intersecting with an LC resonance frequency region out of the entire region obtained from the parasitic capacitance and the parasitic inductance of a semiconductor element are inevitably present under a condition of a particular voltage and a particular temperature. Thus, occurrence of PETT and IMPATT cannot be suppressed. FIG. 14 is a diagram showing an example of distributions of frequencies of PETT and LC resonance in upper-limit-side and lower-limit-side limit designs for a parasitic inductance in a case where the design of the lead frame is corrected. Even if both the upper-limit-side and lower-limit-side limit designs for the parasitic inductance are applied to the design of the lead frame, occurrence of PETT and IMPATT cannot be suppressed, as shown in FIG. 14.

In FIG. 10A, the shortest path of vibration current between the IGBTs disposed in parallel is the bridging portion 202 that connects the IGBTs to each other. Parasitic inductances, on the lead frame 201, between the IGBTs disposed in parallel are considered on the basis of two paths which are the bridging portion 202 and a path extending via each diode. The parasitic inductance value is 8.4 nH between the IGBTs at the path extending via the diode alone and is 2.4 nH between the IGBTs at the bridging portion 202 alone.

A parasitic inductance value between the IGBTs obtained by combining the values at the two paths is 1.9 nH and is approximate to the value at the bridging portion 202 alone. Strong oscillations occur at a path indicated by an arrow shown in FIG. 10 owing to a resonance frequency that is based on: the parasitic inductance value between the IGBTs obtained by combining the values at the two paths; and parasitic capacitances of the IGBTs disposed in parallel. FIG. 3 shows a distribution of LC resonances between the two IGBTs and a distribution of LC resonances between an IGBT and a diode, in the comparative example. Strong oscillations occur under a power-module drive condition of the locations at which distributions of frequencies of PETT with respect to operation voltage and the distribution of the LC resonances between the IGBTs with respect to operation voltage intersect with each other. Measurement was actually performed for vibrations by means of a near-magnetic field probe at the locations indicated by circles in the drawing. The drawing shows observed strengths such that the magnitude of each of actually measured amplitudes is proportionate to the diameter of the corresponding circle. No strong oscillations occurred at the locations at which the distributions of the frequencies of PETT and the distribution of the LC resonances between the IGBT and the diode intersect with each other. This is because the locations of the intersections are present in a PETT limit range of an operating region obtained in a case where the sides where the IGBTs are present are defined as the sources of vibrations.

In FIG. 11A, the shortest path of vibration current between the IGBTs disposed in parallel is the bridging portion 302 that connects the IGBTs to each other. Parasitic inductances, on the lead frame 301, between the IGBTs disposed in parallel are considered on the basis of two paths which are the bridging portion 302 and a path extending via the diode. The parasitic inductance value is 4.3 nH between the IGBTs at the path extending via the diode alone and is 3.0 nH between the IGBTs at the bridging portion 302 alone. The values are approximate to each other. A parasitic inductance value between the IGBTs obtained by combining the values at the two paths is 1.8 nH. Much vibration current is distributed to the path extending via the diode, and thus much vibration current flows through the shortest path extending via the diode between the two IGBTs. Strong oscillations occur at paths indicated by broken-line arrows shown in FIG. 11 owing to resonance frequencies that are based on: the parasitic inductance value obtained via the diode between the two IGBTs; and parasitic capacitances of the diode and the IGBTs at the shortest distances which are not between the two IGBTs but are between the diode and the IGBTs. In addition, strong oscillations occur at a path indicated by a solid-line arrow shown in FIG. 11 owing to a resonance frequency that is based on: the parasitic inductance value between the IGBTs disposed in parallel; and parasitic capacitances of the IGBTs disposed in parallel. FIG. 4 shows a distribution of LC resonances between the two IGBTs and a distribution of LC resonances between an IGBT and the diode, in the comparative example. Strong oscillations occur under a power-module drive condition of the locations at which distributions of frequencies of PETT with respect to operation voltage and the distribution of the LC resonances between the IGBTs with respect to operation voltage intersect with each other. Measurement was actually performed for vibrations by means of a near-magnetic field probe at the locations indicated by circles in the drawing. The drawing shows observed strengths such that the magnitude of each of actually measured amplitudes is proportionate to the diameter of the corresponding circle.

The possibility of occurrence of strong oscillations is considered on the basis of two frequencies which are: a resonance frequency that is based on a parasitic inductance value, on a lead frame, between an IGBT and a diode and a parasitic capacitance generated by the diode and the parasitic capacitance of the IGBT; and a resonance frequency that is based on a parasitic inductance value, on the lead frame, between the two IGBTs and parasitic capacitances of the two IGBTs. In the comparative example shown in FIG. 10, strong oscillations occur owing to the resonance between the two IGBTs as shown in FIG. 3. In the comparative example shown in FIG. 11, strong oscillations occur owing to the resonance between the IGBT and the diode as shown in FIG. 4.

In the comparative example shown in FIG. 10A, the bridging portion 202 which is the connection portion between the IGBTs is thin, and current is concentrated on the route indicated by the arrow so that a magnetic dipole is easily formed. In the comparative example shown in FIG. 11A, the bridging portion 302 which is the connection portion between the IGBTs is thin in the same manner as in FIG. 10A. The shortest path extending between the IGBTs via the diode looks to have a width. However, in terms of the shortest distance, a side along the outer periphery of a hole formed in the lead frame 301 is the path on which vibration current is concentrated. Since a concentrated current loop has an area to some extent, a magnetic dipole is easily formed. When a magnetic dipole is formed, oscillations and strong radiation occur at a resonance point.

<Lead Frames 1 and 2>

A power module that is characterized as follows is obtained. The lead frame 1 and the lead frame 2 each have a thickness that is equal to or larger than two times the depth of a skin through which current flows owing to skin effect generated according to frequency characteristics of any of first, second, and third resonance frequencies of current paths. The first resonance frequency is obtained from LC series connection between: two capacitances parasitic between the one-side surfaces and the other-side surfaces of the two semiconductor elements 3; and two inductances generated between the one-side surfaces and between the other-side surfaces of the two semiconductor elements 3 on the lead frame 1 and the lead frame 2. The second resonance frequency is obtained from LC series connection between: a capacitance generated by each capacitive element 4 and a capacitance parasitic between the one-side surface and the other-side surface of one of the two semiconductor elements 3; and two inductances generated between the capacitive element 4 and the one-side surface of the one of the semiconductor elements 3 and between the capacitive element 4 and the other-side surface of the one of the semiconductor elements 3 on the lead frame 1 and the lead frame 2. The third resonance frequency is obtained from LC series connection between: a capacitance generated by the capacitive element 4 and a capacitance parasitic between the one-side surface and the other-side surface of another one of the two semiconductor elements 3; and two inductances generated between the capacitive element 4 and the one-side surface of the other one of the semiconductor elements 3 and between the capacitive element 4 and the other-side surface of the other one of the semiconductor elements 3 on the lead frame 1 and the lead frame 2. Thus, high-frequency current can be easily caused to flow through the lead frame 1 and the lead frame 2. In addition, the lead frame 1, the lead frame 2, and the capacitive element 4 suppress vibrations caused by any of the first, second, and third resonance frequencies of the current paths each of which is present between two elements arbitrarily selected from among the two semiconductor elements 3 and the capacitive element 4. In a case where the lead frame 1 and the lead frame 2 are made of copper and current flowing through the lead frame 1 and the lead frame 2 is assumed to be a current at a high frequency of 150 MHz, the lead frame 1 and the lead frame 2 each have a thickness of, for example, 32 µm. This value can be realized by, for example: using, for the lead frame 1 or the lead frame 2, tape that has a thickness of 35 µm and that is made of copper; or ensuring, as the lead frame 2, a copper pattern having a thickness of 35 µm on a printed board.

In a case where the IGBTs which are the semiconductor elements 3 and the diodes which are the capacitive elements 4 are connected to each other by the flat-plate-shaped lead frame 1 and the flat-plate-shaped lead frame 2, inductances can be reduced. However, since, in analysis of parasitic inductance, there are regions in which distributions of frequencies of PETT and LC resonances between the elements intersect with each other, there is a possibility that an oscillation phenomenon occurs particularly in the regions in which the intersections are present. FIG. 3 shows the distribution of the LC resonances between the two IGBTs in the power module 100 shown in FIG. 1. FIG. 4 shows the distribution of the LC resonances between the two IGBTs and the distribution of the LC resonances between the IGBT and the diode, in the other power module 100 shown in FIG. 2. Each LC resonance intersects with the distributions of the frequencies of PETT, and thus there is a possibility that oscillations occur.

If vibrations at inductance values are considered in terms of the entireties of paths, paths of vibration current are dispersed from the shortest path between the IGBTs to the path extending via each diode. Consequently, a dynamic distribution is obtained in terms of current density, and a vibration current between the IGBTs and vibration currents between the IGBTs and the diode coexist. Vibrations between the IGBTs are exerted in a direction in which the vibrations are absorbed by the parasitic capacitance of the diode. Meanwhile, vibrations between one IGBT and the diode are exerted in a direction in which the vibrations are absorbed on a side where the parasitic capacitance of the other IGBT is formed. Thus, the vibrations are suppressed. Furthermore, at a difference in voltage between the electrodes of respective ones of the provided elements, current flows for the shortest distance and is applied in such directions as to cancel the vibrations. Consequently, the current is led to be applied in such directions as to suppress both the vibrations between the IGBTs and the vibrations between the IGBTs and the diode. If the parasitic inductance value between the IGBTs and the parasitic inductance value between each IGBT and the diode are caused to approximate to each other, the vibration current between the IGBT and the diode and the vibration current between the IGBTs with different resonance points are caused to interfere with each other, whereby vibrations can be suppressed.

If the lead frame 1 and the lead frame 2 have the shapes of flat plates, and the shortest-distance path between the IGBTs and the shortest-distance paths extending between the IGBTs via the diodes are embedded in the flat plates, a parasitic inductance value between the IGBTs and parasitic inductance values obtained between the IGBTs via the diodes can be caused to approximate to each other. A first condition is that: the IGBTs and each diode are located at the vertices of a triangle such that no diode is included on the shortest-distance path between the IGBTs; and a parasitic inductance between one of the IGBTs and one of the diodes or between another one of the IGBTs and the one of the diodes is, on the path extending between the IGBTs via the diode, equal to or lower than a parasitic inductance at the shortest path between the IGBTs. A second condition is that: in each of the shortest path between the IGBTs and the path extending between the IGBTs via the diode, there is no location at which vibration current is concentrated when the vibration current passes through the shortest path. By satisfying these conditions, vibrations caused by PETT and IMPATT can be suppressed.

In the comparative example shown in FIG. 10, the parasitic inductance value is 8.4 nH between the IGBTs at the path extending via each diode alone and is 2.4 nH between the IGBTs at the bridging portion 202 alone. Meanwhile, in the power module 100 in FIG. 1, the parasitic inductance value is reduced to 3.1 nH between the IGBTs at the path extending via each diode alone and is reduced to 1.4 nH between the IGBTs. By reduction in the parasitic inductance values, the difference in inductance value between the paths is reduced, and vibration current is dispersed. If, relative to one of the IGBTs, there are an inductance at the shortest path to another one of the IGBTs and an inductance on the path extending via each diode and the inductance value between the IGBT and the diode is equal to or smaller than the inductance value at the path to the other one of the IGBTs, vibration current is divided to the path extending via the diode while the first condition is satisfied. In addition, if the lead frame 1 and the lead frame 2 have the shapes of flat plates and the IGBTs and the diodes are connected to each other, there is no location at which vibration current is locally concentrated. Consequently, a vibration current between the IGBTs and vibration currents between the IGBTs and the diodes interfere with each other and are dispersed while the second condition is satisfied. Thus, oscillations are suppressed at either LC resonance frequency.

In order to avoid resonance, it is desirable that the capacitances of the diodes are apart from the parasitic capacitances of the IGBTs. However, even if the capacitances of the diodes and the parasitic capacitances of the IGBTs are not apart from each other, the present disclosure can be implemented unless these elements are of the same type having the same characteristics. The reason is as follows. That is, the parasitic capacitances change according to voltage and temperature and there is also a manufacturing variation, and thus, if the diodes driven in parallel are not of the same type having the same characteristics, the diodes do not have the same characteristics as those of the IGBTs at a change in voltage or temperature, whereby the characteristics of the IGBTs and the diodes do not match each other.

The first condition for causing the parasitic inductance value between the IGBTs and the parasitic inductance value between each IGBT and each diode to approximate to each other, has been described. If the IGBTs and the diode are located at the vertices of the triangle, and the shortest-distance path between the IGBTs and the shortest-distance path between the IGBT and the diode are embedded in the flat-plate-shaped lead frame 1 and lead frame 2, the first condition regarding the parasitic inductances can be rephrased as a magnitude relationship among three distances which are: the shortest distance between the centers of the electrodes of the IGBTs; the shortest distance between the centers of one of the IGBTs and the diode; and the shortest distance between the centers of another one of the IGBTs and the diode. The magnitude relationship corresponds to the relationships of the first expression and the second expression described above.

If the distance relationship expressed by the first expression is satisfied, a parasitic inductance between the diode and an IGBT defined as being closer to the diode can be said to be smaller than a parasitic inductance at the shortest distance between the IGBTs. If the first expression is satisfied, vibration current is easily dispersed and easily flows. If the distance relationships expressed by the first expression and the second expression are satisfied, a smaller one of the angles formed at the intersection point between a line segment formed by the shortest path between one of the IGBTs and the diode and a line segment formed by the shortest path between the IGBTs, is equal to or smaller than 90 degrees, and a smaller one of the angles formed at the intersection point between a line segment formed by the shortest path between another one of the IGBTs and the diode and the line segment formed by the shortest path between the IGBTs, is also equal to or smaller than 90 degrees. If the first expression and the second expression are satisfied, a path of vibration current from each IGBT toward the diode side experiences, at a dynamic change in voltage from the IGBT to the diode, exertion in such a direction as to cause the vibration current to flow so as to head for the diode from one of the IGBTs but, on the way, head for another one of the IGBTs. Consequently, the path of the vibration current is more effectively dispersed. The angle of 90 degrees is obtained from the comparative example. If the shortest paths are considered as lines connecting the above-defined centers of the electrodes to each other, there can be a case where an angle formed by two line segments may exceed 90 degrees owing to a restriction in designing for thermal bonding and wire bonding depending on the size of a chip of an IGBT or the size of a diode. However, when extension lines are drawn from outermost sides of a chip end and a device end, the obtained angle only has to be within 90 degrees in the mutual arrangement relationship between the elements.

In the comparative example shown in FIG. 10, the parasitic inductance value is 1.9 nH between the IGBTs and is, if the paths extending via the diodes are separately considered one by one, 0.7 nH between each IGBT and each diode. In an analysis involving elimination of the bridging portion 202 which is the shortest path between the IGBTs, the inductance obtained via the diode between the IGBTs is 8.4 nH. Meanwhile, the parasitic inductance value in the power module 100 in FIG. 1 is 1.2 nH between the IGBTs if values at all of the paths are combined. However, in a case of imaginarily taking out only the shortest path between the IGBTs at the size and the width of each of the electrodes of the IGBTs and cutting apart the path on the diode side, the parasitic inductance value is 1.4 nH on the path, between the IGBTs, which has been cut out and made into a flat plate. The parasitic inductance value between one of the IGBTs and a closer diode is 0.7 nH and the parasitic inductance value between the one of the IGBTs and a farther diode is 2.3 nH. Since the two paths are formed relative to the closer and farther diodes, a parasitic inductance value obtained by summing the values at both paths is 3.0 nH. An actual parasitic inductance excluding the shortest path between the IGBTs is 3.1 nH, and thus it can be known that the number of bypass paths is not one but two.

In the comparative example shown in FIG. 11 in which the number of diodes is one, the parasitic inductance value is 1.8 nH between the IGBTs, 0.9 nH between one of the IGBTs and the diode, and 0.9 nH between another one of the IGBTs and the diode. The parasitic inductance value is 0.9 nH between either IGBT and the diode, i.e., equal distribution is made. Meanwhile, in the other power module 100 in FIG. 2, the parasitic inductance value is 1.1 nH between the IGBTs, 0.8 nH between one of the ICBM and the diode, and 0.8 nH between another one of the IGBTs and the diode. A parasitic inductance value obtained by combining both values between the IGBTs and the diode is 1.6 nH which is approximate to 1.1 nH between the IGBTs. Since the flat-plate-shaped lead frame 1 is provided and the path on which vibration current is concentrated is eliminated, oscillations are suppressed.

By configuring the power module 100 as described above, the following advantageous effects are obtained. Since the inductance between one of the IGBTs and each diode is smaller than the inductance at the shortest path between the IGBTs, an operation occurs such that about half an oscillation vibration current between the IGBTs flows into a path between the one of the IGBTs and the diode. The current passes via the diode and then branches, along two types of paths, into a current heading for the side where there is another one of the IGBTs and a current returning to the side where there is the one of the IGBTs. A first shortest path between the IGBTs and a second shortest path extending via the diode, are present between the IGBTs. Even if an operation occurs such that vibration current between the IGBTs amplifies vibrations along with an LC resonance obtained from parasitic inductances between the IGBTs and parasitic capacitances between the IGBTs, a larger difference between the voltages of the electrodes of the IGBTs and the voltage of an electrode of the diode causes more current to flow to the diode side. Furthermore, since the IGBTs and the diode are connected to each other by the flat-plate-shaped lead frames 1 and 2, a route to which current flows in from surfaces of the lead frames excluding the portions between the electrodes is ensured. Thus, flow of resonance current can be suppressed.

The above-described advantageous effects will be described using numerical values of parasitic inductances. In the comparative example shown in FIG. 10A, the parasitic inductance value between each IGBT and each diode is 0.7 nH which is smaller than 1.9 nH between the IGBTs. However, passage through the path of the bridging portion 202 between the diodes has to be performed in order to form a second path. Thus, a parasitic inductance value obtained via each diode between the IGBTs is as large as 8.4 nH, and a parasitic inductance value obtained by summing the values at the two paths is 3.7 nH. Vibration current is concentrated on the bridging portion 202 which is shortest between the IGBTs to cause oscillations, whereby a current loop is formed and radiation occurs. Meanwhile, in the power module 100 in FIG. 1, the parasitic inductance value is 1.2 nH between the IGBTs, the total obtained by adding a parasitic inductance value obtained between the IGBTs via one of the diodes is 3.0 nH, and the total obtained by adding a parasitic inductance value obtained between the IGBTs via another one of the diodes is 3.0 nH. Since the paths extending via the two diodes are formed, vibrations can be suppressed without any concentration of vibration current.

In the comparative example shown in FIG. 11A, the bridging portion 302 between the IGBTs is slightly shifted from the centers of the electrodes. Thus, in an analysis with only the bridging portion 302, the parasitic inductance value between the IGBTs is 3.0 nH, and, in a case where the bridging portion 302 between the IGBTs is eliminated, the parasitic inductance value obtained via the diode is 4.3 nH. In this manner, both parasitic inductance values approximate to each other. Thus, vibration current is distributed to both of the two paths. In addition, current is concentrated on the thin bridging portion 302 between the IGBTs, and, on the side where there is the path extending via the diode, the innermost periphery side of a center portion of the lead frame 301 has a shortest distance, and thus vibration current is concentrated on the innermost periphery side. A parasitic inductance value obtained by combining values at all the paths between the IGBTs is 1.8 nH, the parasitic inductance value between each IGBT and the diode is 0.9 nH, and oscillations occur on both paths. Meanwhile, in the other power module 100 in FIG. 2, the parasitic inductance value is 1.1 nH between the IGBTs and Ls 0.8 nH between each IGBT and the diode. In this manner, both values approximate to each other. Thus, vibration current branches, there is no path on which vibration current is concentrated, and current flows at a difference in voltage between the electrodes of the diode and the two IGBTs, whereby vibrations can be suppressed. In the sense of equally dividing an inductance into values and causing the values to approximate to each other, there is no significant difference between the comparative example shown in FIG. 11 and the other power module 100. However, the bridging portion 302 on which vibration current is concentrated and which is present between the IGBTs and the shortest path on which vibration current is concentrated and which is present on a side along the outer periphery of the hole formed in the lead frame 301 are eliminated from the comparative example by closing the hole in the lead frame 301, and current is allowed to flow through any path at a change in voltage between each IGBT and the diode. Consequently, vibration current is more widely distributed, and vibrations can be suppressed.

In FIG. 3, the distribution of the LC resonances between the two IGBTs in the power module 100 intersects with the distributions of the frequencies of PETT. In FIG. 4, the distribution of the LC resonances between the two IGBTs and the distribution of the LC resonances between the IGBT and the diode in the other power module 100, intersect with the distributions of the frequencies of PETT. Although a possibility of occurrence of oscillations at the locations of the intersections has been predicted, no oscillations detectable with a near-magnetic field probe have occurred at the locations of the intersections. This is because, in either of the power modules 100, vibration current is not concentrated, thereby suppressing vibrations.

Description has been made above with the two IGBTs being regarded as the sources of vibrations. However, the same description can apply to a case where the sources of vibrations connected in parallel is on the diode side instead. In the comparative example shown in FIG. 10A, the parasitic inductance value between the diodes is 2.9 nH, and the parasitic inductance value obtained between the diodes via each IGBT with the bridging portion 202 being eliminated is 8.6 nH. Since there is a difference between both parasitic inductance values, vibration current flows to the bridging portion 202 between the diodes, and oscillations occur at the time of reverse recovery operations of the diodes. Meanwhile, in the power module 100 in FIG. 1, the parasitic inductance value between the diodes is 2.3 nH, and the parasitic inductance value obtained between the diodes via each IGBT is 3.7 nH. Since the difference between both parasitic inductance values is reduced and the parasitic inductance value between each IGBT and each diode is as small as 0.7 nH, vibration current flows between the diodes via the IGBT, whereby vibrations can be suppressed also on the diode side.

The lead frame 1 is formed in the shape of a flat plate. As shown in FIG. 1 and FIG. 2, the lead frame 1 has through holes 1b at locations corresponding to locations between the IGBTs and the diodes. Each power module 100 includes an insulation filler such as a gel or a mold resin enclosing the semiconductor elements 3 and the like inside the power module 100 in order to ensure insulation performance for the power module 100. Depending on the viscosity of the insulation filler at the time of filling, there is a case where a portion between the lead frame 1 and the lead frame 2 is not filled with the insulation filler, and large and small voids are formed, whereby insulation performance is not obtained for the power module 100. By forming the through holes 1b in the lead frame 1 according to the viscosity of the insulation filler at the time of filling, the portion between the lead frame 1 and the lead frame 2 can be filled, to every corner thereof, with the insulation filler.

As described above, in each power module 100 according to the first embodiment, the two semiconductor elements 3 and each capacitive element 4 are located at the vertices of a triangle between the flat-plate-shaped lead frame 1 and the flat-plate-shaped lead frame 2. If a shortest connection length path between the two semiconductor elements 3 on the lead frame 1 and the lead frame 2, is defined as a first shortest path, and a shorter path and a longer path out of two shortest connection length paths between the capacitive element 4 and the two respective semiconductor elements 3 on the lead frame 1 and the lead frame 2, are respectively defined as a second shortest path and a third shortest path, (first shortest path)≥(second shortest path) and ((first shortest path)$^2$+(second shortest path)$^2$)≥(third shortest path)$^2$ are satisfied. The lead frame 1 and the lead frame 2 each have a thickness that is equal to or larger than two times the depth of the skin through which current flows owing to skin effect generated according to frequency characteristics of current paths having: the first resonance frequency obtained from capacitances and inductances between the two semiconductor elements 3; the second resonance frequency obtained from a capacitance and inductances between one of the two semiconductor elements 3 and one of the capacitive elements 4; and the third resonance frequency obtained from a capacitance and inductances between another one of the two semiconductor elements 3 and the one of the capacitive elements 4. Accordingly, vibration currents caused by PETT and IMPATT are prevented from being concentrated on a part of the paths on the lead frame 1 and the lead frame 2, whereby vibrations caused by PETT and IMPATT can be suppressed.

In addition, since vibrations caused by PETT and IMPATT are suppressed, it is possible to inhibit: a malfunction of the drive circuit for driving the power module 100; and breakage of the semiconductor elements 3 due to induction of gate vibrations. Also in a case where IGBTs or bipolar transistors are used as the two semiconductor elements 3 and p-n junction diodes or Schottky junction diodes are used as the capacitive elements 4, vibration currents caused by PETT and IMPATT are not concentrated on a part of the paths on the lead frame 1 and the lead frame 2, whereby vibrations caused by PETT and IMPATT can be suppressed.

Second Embodiment

A power module 100 according to a second embodiment will be described. The power module 100 according to the second embodiment includes power semiconductor elements 3 in each of which a depletion layer is formed.

The two semiconductor elements 3 of the power module 100 shown in FIG. 1 or FIG. 2 are made into two power semiconductor elements 3 in each of which a depletion layer is formed at the time of turn-off or at the time of switch-off from forward bias to reverse bias. A frequency determined according to a movement and discharge time that majority-side carriers take to pass through the depletion layer inside each power semiconductor element owing to occurrence of a local breakdown limit value electric field inside the power semiconductor element at the time of the turn-off or at the time of the switch-off, is defined as a first intrinsic vibration count. A frequency determined according to a movement and discharge time that minority-side carriers take to pass through the depletion layer inside the power semiconductor element of a bipolar type at the time of the turn-off or at the time of the switch-off, is defined as a second intrinsic vibration count.

Each of the two power semiconductor elements connected in parallel is a power semiconductor element having only the first intrinsic vibration count or a power semiconductor element having both the first intrinsic vibration count and the second intrinsic vibration count. When the two power semiconductor elements are driven, frequencies of the first intrinsic vibration count and the second intrinsic vibration count are distributed over a wide range depending on the conditions of voltage and temperature. In a case where the first intrinsic vibration count includes a frequency that matches any of the first resonance frequency, the second resonance frequency, and the third resonance frequency described in the first embodiment or in a case where the second intrinsic vibration count includes a frequency that matches any of the first resonance frequency, the second resonance frequency, and the third resonance frequency described in the first embodiment, if the power module 100 has the configuration described in the first embodiment, vibration currents caused by PETT and IMPATT are prevented from being concentrated on a part of the paths on the lead frame 1 and the lead frame 2, whereby vibrations caused by PETT and IMPATT can be suppressed. That is, with the two power semiconductor elements in each of which the depletion layer is formed, vibrations caused by PETT and IMPATT can be suppressed even if the first resonance frequency, the second resonance frequency, and the third resonance frequency are included within a frequency range in which the first intrinsic vibration count and the second intrinsic vibration count are distributed.

As described above, the power module 100 according to the second embodiment includes the two power semiconductor elements 3 in each of which the depletion layer is formed. Each of the two power semiconductor elements is a power semiconductor element having only the first intrinsic vibration count or a power semiconductor element having both the first intrinsic vibration count and the second intrinsic vibration count. The first resonance frequency, the second resonance frequency, and the third resonance frequency are included within the frequency range in which the first intrinsic vibration count and the second intrinsic vibration count are distributed. Thus, vibrations caused by PETT and IMPATT can be suppressed also with the two power semiconductor elements 3 in each of which the depletion layer is formed.

Third Embodiment

Figure 5:
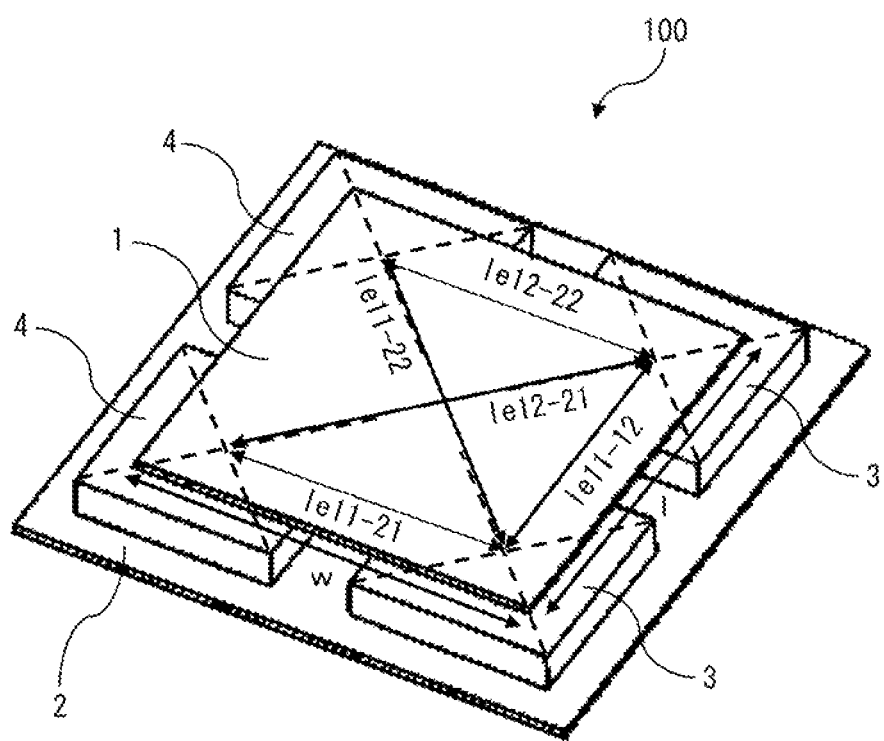
FIG. 5 is a perspective view schematically showing major parts of a power module according to a third embodiment.

A power module 100 according to a third embodiment will be described. FIG. 5 is a perspective view schematically showing major parts of the power module 100 according to the third embodiment. The power module 100 according to the third embodiment includes semiconductor elements 3 and capacitive elements 4 which are different from those described in the first embodiment.

In FIG. 5, each of the two semiconductor elements 3 is a metal oxide semiconductor field effect transistor or a reverse-conduction insulated-gate bipolar transistor. Each capacitive element 4 is a capacitor that is disposed between the plate-shaped lead frame 1 and the plate-shaped lead frame 2 and that is formed of an insulation filler. The insulation filler may be an air space, a resin material, or a gel material as long as the insulation filler has a uniform permittivity.

An example in which two capacitive elements 4 are provided has been shown in FIG. 5. However, the number of capacitive elements 4 may be one or may be three or more. In either case, the two semiconductor elements 3 and one capacitive element 4 are located at the vertices of a triangle on the same plane. The lead frame 1 has an area of l×w where "l" represents a lateral width and "w" represents a longitudinal width. The lead frame 1 is disposed so as to cover the centers of the semiconductor elements 3 and the capacitive elements 4. The centers of the semiconductor elements 3 and the capacitive elements 4 are located at the intersection points of broken lines shown in the drawing. Each of one-side surfaces and other-side surfaces of the semiconductor elements 3 and the capacitive elements 4 includes an electrode (not shown).

The distances between the centers of the elements will be described as follows. As shown in FIG. 5, the distance between the semiconductor elements 3 is denoted by le11-12, the distance between one of the semiconductor elements 3 and one of the capacitive elements 4 is denoted by le11-21, the distance between the one of the semiconductor elements 3 and another one of the capacitive elements 4 is denoted by le11-22, the distance between another one of the semiconductor elements 3 and the one of the capacitive elements 4 is denoted by le12-21, and the distance between the other one of the semiconductor elements 3 and the other one of the capacitive elements 4 is denoted by le12-22. If the distances satisfy $(le11\text{-}12) \geq (le11\text{-}21)$ and $((le11\text{-}12)^2+(le11\text{-}21)^2) \geq (le12\text{-}21)^2$ or satisfy $(le11\text{-}12) \geq (le12\text{-}22)$ and $((le11\text{-}12)^2+(le12\text{-}22)^2) \geq (le11\text{-}22)^2$, vibrations caused by PETT and IMPATT can be suppressed.

As described above, in the power module 100 according to the third embodiment, each of the two semiconductor elements 3 is a metal oxide semiconductor field effect transistor or a reverse-conduction insulated-gate bipolar transistor, and each capacitive element 4 is a capacitor that is disposed between the lead frame 1 and the lead frame 2 and that is formed of the insulation filler. Also in this case, vibration currents caused by PETT and IMPATT are prevented from being concentrated on a part of the paths on the lead frame 1 and the lead frame 2, whereby vibrations caused by PETT and IMPATT can be suppressed.

Fourth Embodiment

Figure 6A:
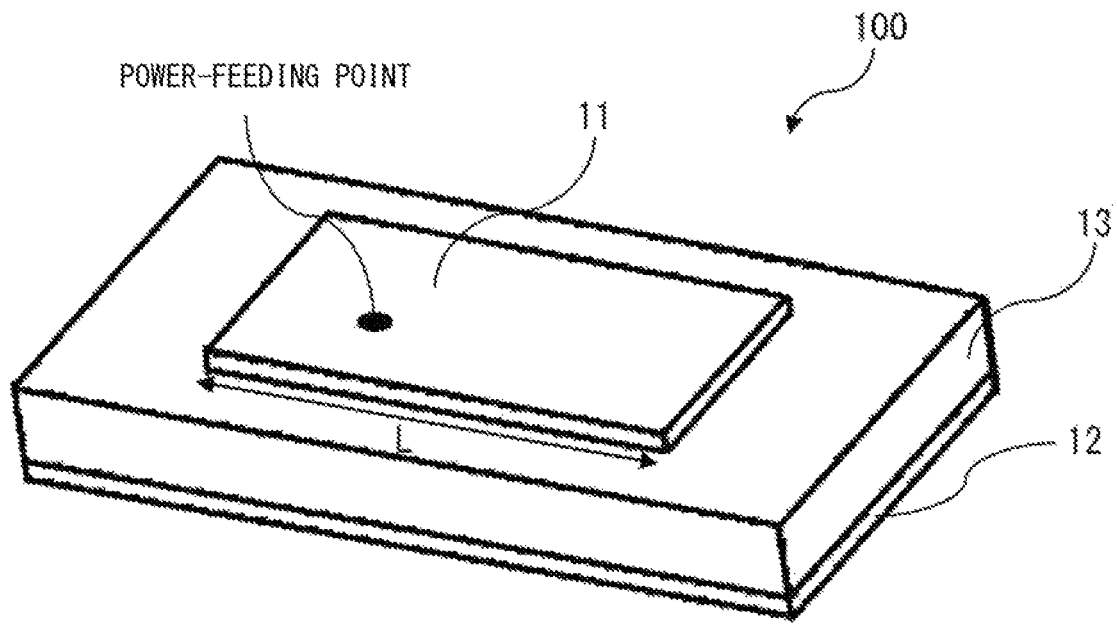
FIG. 6A is a perspective view schematically showing major parts of a power module according to a fourth embodiment.

A power module 100 according to a fourth embodiment will be described. FIG. 6A is a perspective view schematically showing major parts of the power module 100 according to the fourth embodiment. In the power module 100 according to the fourth embodiment, the lead frame 1 has a function of a flat plate antenna.

Figure 6B:
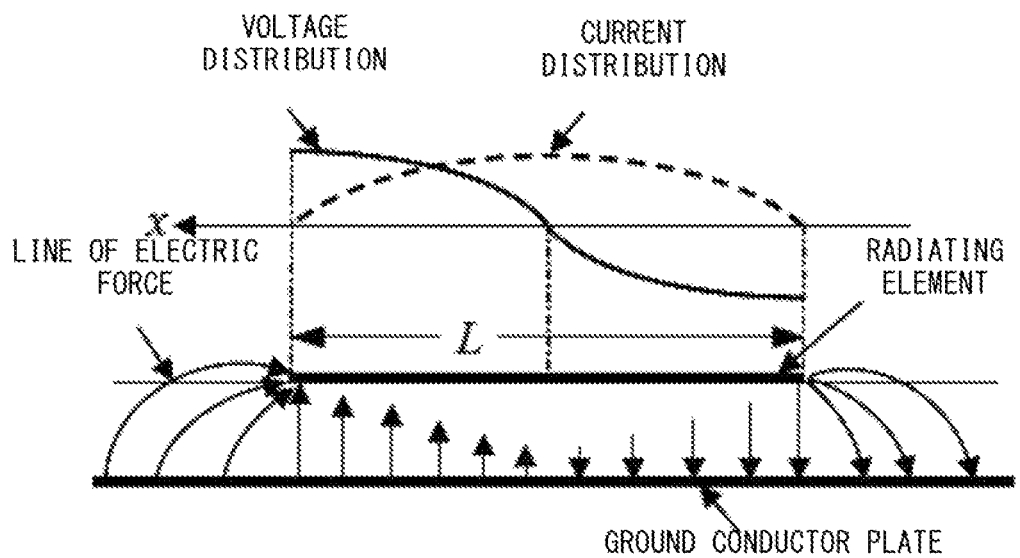
FIG. 6B illustrates a radiation frequency.

The lead frame 1 functions as a flat plate antenna 11 with the lead frame 2 functioning as a ground, at a change in the voltage of each of the two semiconductor elements 3 or the capacitive element 4 of the power module 100. FIG. 6A shows the power module 100 in which an insulating dielectric 13 corresponding to the capacitive element 4 is disposed between the flat plate antenna 11 corresponding to the lead frame 1 and a ground 12 corresponding to the lead frame 2. A power-feeding point for the flat plate antenna 11 is located at, for example, a black circle shown in FIG. 6A. FIG. 6B illustrates a radiation frequency from a patch antenna which is the flat plate antenna 11. Regarding the radiation frequency of a radio wave radiated from the patch antenna expressed by the expression shown in FIG. 6B, a voltage distribution and a current distribution respectively indicated by a solid line and a broken line in FIG. 6B indicate fundamental waves. In the expression, $c_0$ represents the speed of light, $\varepsilon_r$ represents the permittivity of the dielectric, and $L_e$ represents the length of a long side of the patch antenna. In FIG. 6B, the ground conductor plate corresponds to the lead frame 2 in FIG. 6A, and the radiating element corresponds to the lead frame 1 in FIG. 6A. If the radiation frequency expressed by the expression shown in FIG. 6B is higher than the first resonance frequency, the second resonance frequency, and the third resonance frequency described in the first embodiment, i.e., if the radiation frequency is high without any overlap with the distributions of the frequencies of PETT and IMPATT, resonance between the lead frame 1 and the radiation frequency can be avoided.

As described above, in the power module 100 according to the fourth embodiment, the lead frame 1 functions as the flat plate antenna 11 with the lead frame 2 functioning as a ground, at a change in the voltage of each of the two semiconductor elements 3 or the capacitive element 4 of the power module 100. The radiation frequency, of the radio wave, which is expressed by the expression shown in FIG. 6B and which belongs to the flat plate antenna 11 as a characteristic is higher than the first resonance frequency, the second resonance frequency, and the third resonance frequency. Thus, it is possible to avoid resonance between the lead frame 1 and the radiation frequency and suppress energy emission to the radiation side as the flat plate antenna 11.

Fifth Embodiment

Figure 7:
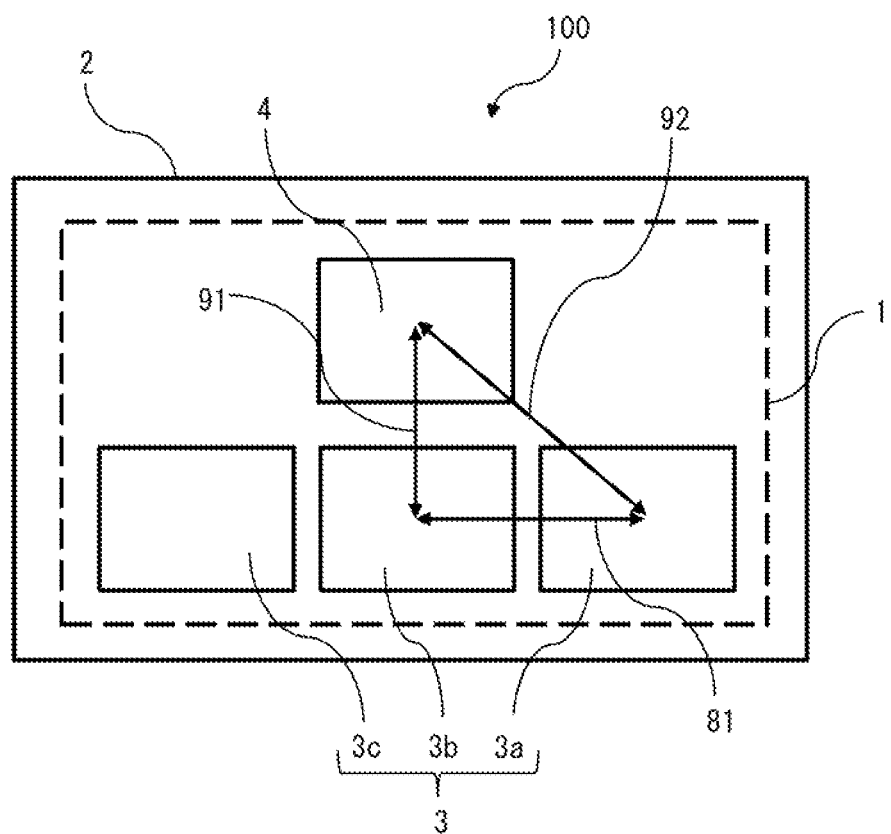
FIG. 7 is a plan view schematically showing major parts of a power module according to a fifth embodiment.

A power module 100 according to a fifth embodiment will be described. FIG. 7 is a plan view schematically showing major parts of the power module 100 according to the fifth embodiment. The power module 100 according to the fifth embodiment includes three semiconductor elements 3.

As shown in FIG. 7, the power module 100 includes three semiconductor elements 3a, 3b, and 3c, a capacitive element 4, the flat-plate-shaped lead frame 1, and the flat-plate-shaped lead frame 2. Regarding the lead frame 1, only the contour thereof is indicated by a broken line. Although the three semiconductor elements 3a, 3b, and 3c are provided here, the number thereof is not limited to three, and n (where "n" represents an integer not less than 3) semiconductor elements 3 may be provided. The capacitive element 4 and two adjacent semiconductor elements 3 selected from among the three semiconductor elements 3 are located at the vertices of a triangle on the same plane.

The locations of the vertices of the triangle are arranged as follows. That is, if a shortest connection length path between the two adjacent semiconductor elements 3 on the lead frame 1 and the lead frame 2, is defined as a first shortest path, and a shorter path and a longer path out of two shortest connection length paths between the capacitive element 4 and the two respective adjacent semiconductor elements 3 on the lead frame 1 and the lead frame 2, are respectively defined as a second shortest path and a third shortest path, the relationships of (first shortest path)≥(second shortest path) and ((first shortest path)²+(second shortest path)²)≥(third shortest path)² are satisfied. The former one of the expressions is defined as a first expression, and the latter one of the expressions is defined as a second expression. If the two adjacent semiconductor elements 3 in FIG. 7 are defined as semiconductor elements 3a and 3b, the first expression is (first shortest path 81)≥(second shortest path 91), and the second expression is ((first shortest path 81)²+(second shortest path 91)²)≥(third shortest path 92)².

The lead frame 1 and the lead frame 2 each have a thickness that is equal to or larger than two times the depth of a skin through which current flows owing to skin effect generated according to frequency characteristics of current paths having: a first resonance frequency obtained from capacitances and inductances between the two adjacent semiconductor elements 3; a second resonance frequency obtained from a capacitance and inductances between the capacitive element 4 and one of the two adjacent semiconductor elements 3; and a third resonance frequency obtained from a capacitance and inductances between the capacitive element 4 and another one of the two adjacent semiconductor elements 3.

As described above, in the power module 100 according to the fifth embodiment, the capacitive element 4 and two adjacent semiconductor elements 3 selected from among the three semiconductor elements 3 are located at the vertices of the triangle between the flat-plate-shaped lead frame 1 and the flat-plate-shaped lead frame 2. The relationships of the first expression and the second expression are satisfied. The lead frame 1 and the lead frame 2 each have a thickness that is equal to or larger than two times the depth of the skin through which current flows owing to skin effect. With these features, vibration currents caused by PETT and IMPATT are prevented from being concentrated on a part of the paths on the lead frame 1 and the lead frame 2, whereby vibrations caused by PETT and IMPATT can be suppressed.

Sixth Embodiment

Figure 8:
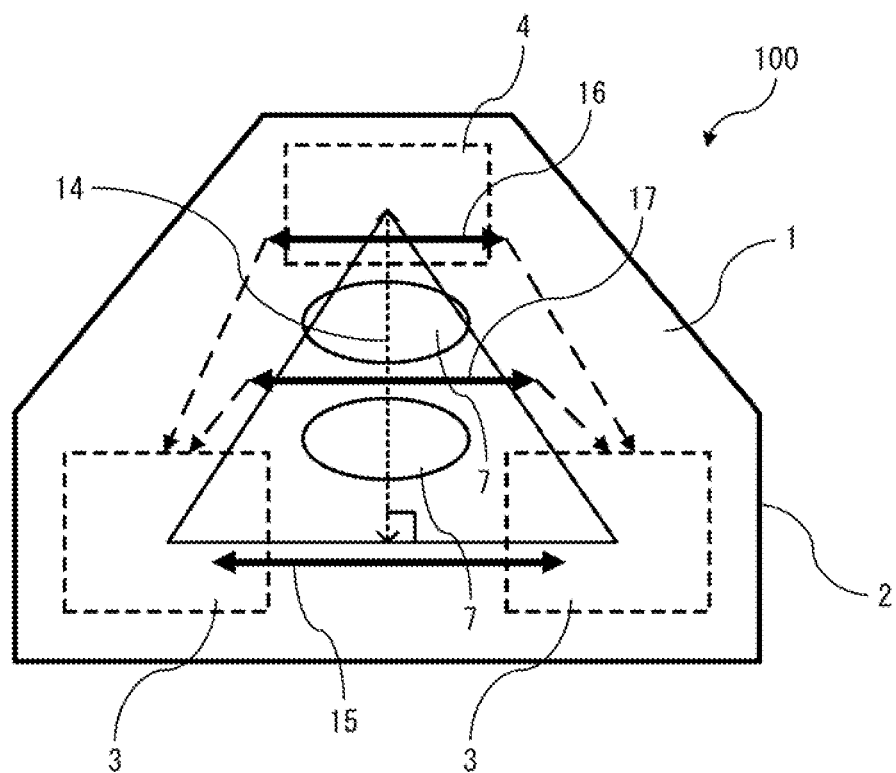
FIG. 8 is a plan view schematically showing major parts of a power module according to a sixth embodiment.

A power module 100 according to a sixth embodiment will be described. FIG. 8 is a plan view schematically showing major parts of the power module 100 according to the sixth embodiment. In the power module 100 according to the sixth embodiment, one or both of the plate-shaped lead frames 1 and 2 each have through holes 7.

Two semiconductor elements 3 and a capacitive element 4 are located at the vertices of a triangle on the same plane. As shown in FIG. 8, one or both of the lead frame 1 and the lead frame 2 each have two or more through holes 7 on a perpendicular 14 drawn downward, to a shortest path 15 which is the shortest connection path between the two semiconductor elements 3, from the location at which the capacitive element 4 is connected to the lead frame 1 or the lead frame 2. FIG. 8 shows an example in which the lead frame 1 has two through holes 7. By forming the two through holes 7, a bypass path 17 is provided. Thus, the paths of vibration current flowing between the semiconductor elements 3 are not limited to two paths including: a first path which is the shortest path 15 between the semiconductor elements 3; and a second path which is a via-capacitance path 16 extending via the capacitive element 4. By providing the bypass path 17, vibration current is dispersed without being concentrated on the first path or the second path. The vibration-suppressing effect can be enhanced by increasing the number of through holes 7 or reducing the areas of the through holes 7. It is noted that, when an insulation filler is provided, the through holes 7 serve also to fill the portion between the lead frame 1 and the lead frame 2 with the insulation filler.

As described above, in the power module 100 according to the sixth embodiment, one or both of the lead frame 1 and the lead frame 2 each have the two or more through holes 7 on the perpendicular 14 drawn downward, to the shortest connection path between two semiconductor elements 3, from the location at which the capacitive element 4 is connected to the lead frame 1 or the lead frame 2. Thus, the bypass path 17 is provided to the lead frames having the through holes 7. Consequently, vibration currents caused by PETT and IMPATT are prevented from being concentrated on a part of the paths on the lead frames having the through holes 7, whereby vibrations caused by PETT and IMPATT can be suppressed.

Seventh Embodiment

Figure 9:
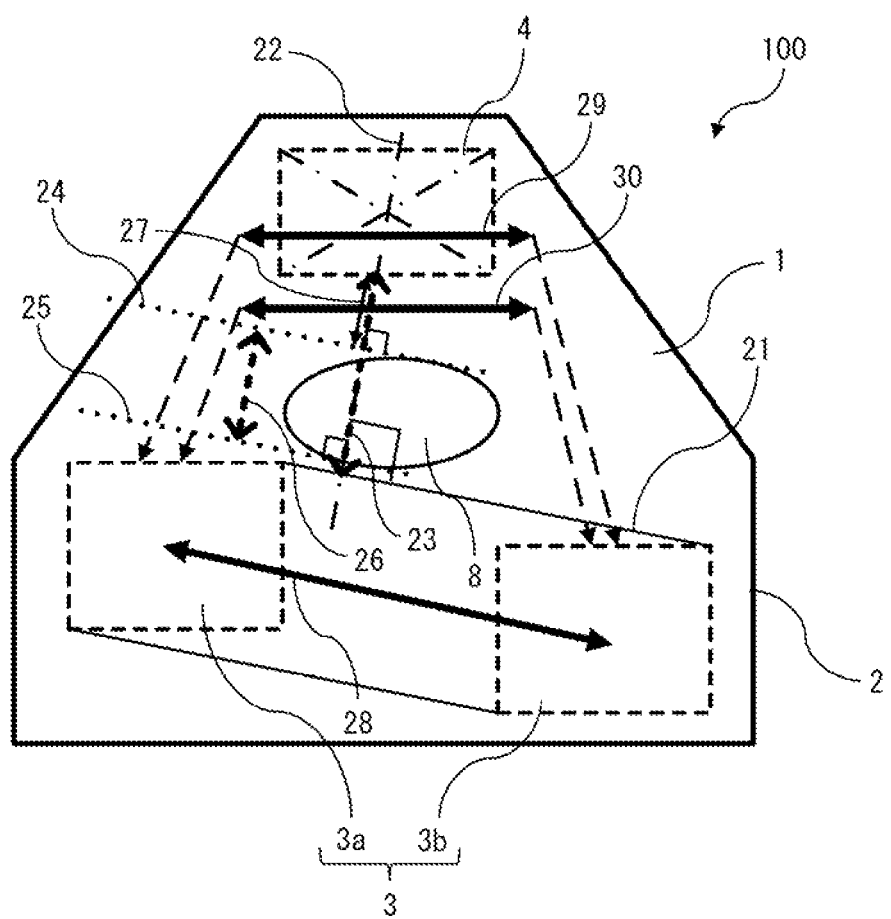
FIG. 9 is a plan view schematically showing major parts of a power module according to a seventh embodiment.

A power module 100 according to a seventh embodiment will be described. FIG. 9 is a plan view schematically showing major parts of the power module 100 according to the seventh embodiment. The power module 100 according to the seventh embodiment includes a through hole 8 having a specified size.

Each of the two semiconductor elements 3 and the capacitive element 4 located at the vertices of a triangle has a rectangular shape. The capacitive element 4 is disposed such that one long side thereof faces one long side of each of the two semiconductor elements 3. One or both of the lead frame 1 and the lead frame 2 each have the through hole 8 between the capacitive element 4 and the two semiconductor elements 3. FIG. 9 shows an example in which the lead frame 1 has the through hole 8.

A value obtained by subtracting a hole width 26 from a bypass path width 23 is equal to or larger than ½ the length of a short side of the capacitive element 4 where: the bypass path width 23 is the length of a portion, of a perpendicular 22, from an outer periphery of the capacitive element 4 to a line segment 21 which connects a corner, of one semiconductor element 3a located closer to the capacitive element 4 out of the two semiconductor elements 3, that is closest to the capacitive element 4 to a corner that is an end, of a long side of another semiconductor element 3b facing the capacitive element 4, that is farther from the capacitive element 4, the perpendicular 22 being drawn downward to the line segment 21 from the center of the location at which the capacitive element 4 is connected to the lead frame 1 or the lead frame 2; and the hole width 26 is the distance between two perpendiculars 24 and 25 drawn downward to the perpendicular 22 from circumferential portions, of the through hole 8, that are farthest from each other as viewed in a direction of the perpendicular.

The value obtained by subtracting the hole width 26 from the bypass path width 23 is a bypassing-enabling width 27 enabling vibration current to flow. Vibration currents flowing between the two semiconductor elements 3 pass through, if not through a shortest path 28 between the two semiconductor elements 3, a via-capacitance path 29 extending via the capacitive element 4 and a bypass path 30 extending via the bypassing-enabling width 27. Not all of vibration currents flowing in directions from the semiconductor elements 3 to the capacitive element 4 head for the capacitive element 4, and a vibration current passes through the bypass path 30. Thus, the vibration currents are dispersed and vibrations can be further suppressed.

The feature of setting the bypassing-enabling width 27 to be equal to or larger than ½ the length of the short side of the capacitive element 4, will be described. Description will be given here using an example in which IGBTs are used as the semiconductor elements 3 and a diode is used as the capacitive element 4. In a case where the power module 100 is mounted with the capacitive element 4 with only the function of the diode, when the lead frame 1 is mounted to an electrode of the diode, the width of the lead frame 1 only has to be, and does not need to be larger than, the width of a short side of the diode. Also if current flowing to the IGBTs coupled to each other is considered in terms of an originally-intended function which is commutation at the time of turning off the IGBTs, designing is performed such that, at most, the width of the short side of the diode is directly adopted as the width of the lead frame 1 so as to prevent current from flowing off the electrode of the diode.

Here, the fact that the value obtained by subtracting the hole width 26 from the bypass path width 23 is equal to or larger than zero, means that there is a use other than commutation at the time of turning off the IGBTs. In actuality, a drawback arises in terms of machining accuracy, and thus a margin of several millimeters is taken into account for a final shape. The fact that, in the final shape, the said value is ½ the length of the short side of the capacitive element 4, means that there is a path for the purpose of releasing current to a location between the IGBTs besides the purpose of causing current to flow to a location between each IGBT and the diode. This leads to the conclusion that, when a diode having no function other than commutation at the time of turning off the IGBTs is considered, the only purpose is to suppress noises caused by vibrations.

In the comparative example shown in FIG. 11A, the value obtained by subtracting the hole width from the bypass path width is zero. In this case, a path on which vibration current is concentrated is present along the outer periphery of the hole. The vibration current is a current that has vibrated owing to a parasitic capacitance between an IGBT and the diode. If the bypassing-enabling width 27 is set to be equal to or larger than ½ the length of the short side of the capacitive element 4, the vibration current can pass through the bypass path 30 which is separate from the via-capacitance path 29 and the shortest path 28. This can contribute to suppression of vibrations.

As described above, in the power module 100 according to the seventh embodiment, one or both of the lead frame 1 and the lead frame 2 each have the through hole 8 between the capacitive element 4 and the two semiconductor elements 3. A value obtained by subtracting a distance from a length is equal to or larger than ½ a length of a short side of the capacitive element 4 where: the length from which the distance is subtracted is a length of a portion, of a perpendicular 22, from an outer periphery of the capacitive element 4 to a line segment 21 which connects a corner, of one semiconductor element 3a Located closer to the capacitive element 4 out of the two semiconductor elements 3, that is closest to the capacitive element 4 to a corner that is an end, of a long side of another semiconductor element 3b facing the capacitive element 4, that is farther from the capacitive element 4, the perpendicular 22 being drawn downward to the line segment from a center of a location at which the capacitive element 4 is connected to the lead frame 1 or the lead frame 2; and the distance is a distance between two perpendiculars 24 and 25 drawn downward to the perpendicular 22 from circumferential portions, of the through hole 8, that are farthest from each other as viewed in a direction of the perpendicular. Thus, a vibration current can pass through the bypass path 30 which is separate from the via-capacitance path 29 and the shortest path 28. Consequently, vibration currents can be dispersed, whereby vibrations caused by PETT and IMPATT can be suppressed.

Although the disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the specification of the present disclosure. For example, at least one of the constituent parts may be modified, added, or eliminated. At least one of the constituent parts mentioned in at least one of the preferred embodiments nay be selected and combined with the constituent parts mentioned in another preferred embodiment.

DESCRIPTION OF THE REFERENCE CHARACTERS 1 lead frame
1a terminal portion
1b through hole
2 lead frame
3 semiconductor element
4 capacitive element
5 lead frame
6 electrode
7 through hole
8 through hole
11 flat plate antenna
12 ground
13 insulating dielectric
14 perpendicular
15 shortest path
16 via-capacitance path
17 bypass path
21 line segment
22 perpendicular
23 bypass path width
24 perpendicular
25 perpendicular
26 hole width
27 bypassing-enabling width
28 shortest path
29 via-capacitance path
30 bypass path
100 power module
200 power module
201 lead frame
202 bridging portion
300 power module
301 lead frame
302 bridging portion

What is claimed is:

1. A power module comprising:
two semiconductor elements comprising a first semiconductor element and a second semiconductor element, wherein each of the two semiconductor elements has an electrode on each of a one-side surface and an other-side surface of the each semiconductor element, wherein the two semiconductor elements are of a same size and the two semiconductor elements are electrically connected in parallel;
a first electrically conductive metal pattern connected to the electrode on the one-side surface of each of the two semiconductor elements arranged on a same plane, wherein the first electrically conductive metal pattern is flat and plate-shaped;
a second electrically conductive metal pattern connected to the electrode on the other-side surface of each of the two semiconductor elements, wherein the second electrically conductive metal pattern is flat and plate-shaped; and
a capacitive element disposed between the first electrically conductive metal pattern and the second electrically conductive metal pattern and forming a capacitance between the first electrically conductive metal pattern and the second electrically conductive metal pattern, wherein
the two semiconductor elements and the capacitive element are located at vertices of a triangle on the same plane,
the first electrically conductive metal pattern and the second electrically conductive metal pattern are each characterized by having a flat-plate shape with a contour within which three vertices and three sides of the triangle are included,
wherein
a shortest connection length path between a first electrode of the first semiconductor element and a second electrode of the second semiconductor element on the first electrically conductive metal pattern and the second electrically conductive metal pattern, is a first shortest path, and
a shorter path and a longer path out of two shortest connection length paths between a third center of the capacitive element and a first center of the first semiconductor element and a second center of the second semiconductor element on the first electrically conductive metal pattern and the second electrically conductive metal pattern, are respectively a second shortest path and a third shortest path associated with the capacitive element,
wherein a geometric placement of the capacitive element includes:
i) (the first shortest path)≥(the second shortest path) and
ii) ((the first shortest path)$^2$+(the second shortest path)$^2$)≥(the third shortest path)$^2$
wherein
a first resonance frequency is associated with first parasitic capacitances between the one-side surface and the other-side surface of each of the two semiconductor elements and two first parasitic inductances between the one-side surface and between the other-side surface of each of the two semiconductor elements on the first electrically conductive metal pattern and the second electrically conductive metal pattern,
a second resonance frequency is associated with the capacitive element and a second parasitic capacitance between the one-side surface and the other-side surface of one of the two semiconductor elements and two second parasitic inductances associated respectively between the capacitive element and the one-side surface of the one of the semiconductor elements and between the capacitive element and the other-side surface of the one of the semiconductor elements on the first electrically conductive metal pattern and the second electrically conductive metal pattern, and a third resonance frequency is associated with the capacitive element and a third parasitic capacitance between the one-side surface and the other-side surface of another one of the two semiconductor elements and two third parasitic inductances associated respectively between the capacitive element and the one-side surface of the other one of the semiconductor elements and between the capacitive element and the other-side surface of the other one of the semiconductor elements on the first electrically conductive metal pattern and the second electrically conductive metal pattern, wherein the first electrically conductive metal pattern and the second electrically conductive metal pattern each have a thickness that is equal to or larger than two times a depth of a skin through which a first current is configured to flow owing to a skin effect associated with the first resonance frequency, the second resonance frequency, or the third resonance frequency, and wherein the geometric placement of the capacitive element is configured to reduce vibrations associated with the first resonance frequency, the second resonance frequency, and/or the third resonance frequency by causing the first current to be dispersed from between the two semiconductor elements to the second shortest path and the third shortest path associated with the capacitive element.

2. The power module according to claim 1, comprising:
n semiconductor element, wherein n is an integer not less than 3, wherein the n semiconductor elements each has a second electrode on each of the one-side surface and the other-side surface of the each semiconductor element, wherein the n semiconductor elements comprise the two semiconductor elements;

the first electrically conductive metal pattern is connected to the second electrode on the one-side surface of each of the n semiconductor elements arranged on the same plane;

the second electrically conductive metal pattern is connected to the second electrode on the other-side surface of each of the n semiconductor elements; and the capacitive element is disposed between the first electrically conductive metal pattern and the second electrically conductive metal pattern, wherein the two semiconductor elements are two adjacent semiconductor elements among the n semiconductor elements, and the two semiconductor elements and the capacitive element are located at the vertices of the triangle on the same plane.

3. The power module according to claim 2, wherein
the two adjacent semiconductor elements are two adjacent power semiconductor elements in each of which a depletion layer is formed at a first time of a turn-off or at a second time of a switch-off from forward bias to reverse bias, wherein
a first frequency determined according to a first movement and discharge time that majority-side carriers take to pass through the depletion layer inside each power semiconductor element at the first time of the turn-off or at the second time of the switch-off, is a first intrinsic vibration count, and
a second frequency determined according to a second movement and discharge time that minority-side carriers take to pass through the depletion layer inside the power semiconductor element of a bipolar type at the first time of the turn-off or at the second time of the switch-off, is second intrinsic vibration count, each of the two adjacent power semiconductor elements has only the first intrinsic vibration count or has both the first intrinsic vibration count and the second intrinsic vibration count, the first resonance frequency, the second resonance frequency, and the third resonance frequency are included within a frequency range in which the first intrinsic vibration count and the second intrinsic vibration count are distributed, and wherein the geometric placement of the capacitive element is configured to suppress second vibrations otherwise caused by the first intrinsic vibration count or the second intrinsic vibration count and any of the first, second, and third resonance frequencies.

4. The power module according to claim 2, wherein
A) each of the two semiconductor elements is a first insulated-gate bipolar transistor, a first bipolar transistor, or a first metal oxide semiconductor field effect transistor, and the capacitive element is a first p-n junction diode or a Schottky junction diode, or
B) each of the two semiconductor elements is a second p-n junction diode or a second Schottky junction diode, and the capacitive element is a second insulated-gate bipolar transistor, a second bipolar transistor, or a second metal oxide semiconductor field effect transistor.

5. The power module according to claim 2, wherein
each of the two adjacent semiconductor elements is a metal oxide semiconductor field effect transistor or a reverse-conduction insulated-gate bipolar transistor, and the capacitive element is a capacitor that is disposed between the first electrically conductive metal pattern and the second electrically conductive metal pattern and that is formed of an insulation filler.

6. The power module according to claim 2, wherein
the first electrically conductive metal pattern is associated with a first behavior as a flat plate antenna with the second electrically conductive metal pattern is associated with a second behavior as a ground, at a change in a voltage of each of the two semiconductor elements or the capacitive element, and $fr = c_0/(2L_e\sqrt{\varepsilon_r})$ (where $c_0$ represents a speed of light, $\varepsilon_r$ represents a permittivity of an element, and $L_e$ represents a length of a long side of the flat plate antenna) indicating a fundamental radiation frequency of a radio wave and obtained from longitudinal and lateral dimensions of the flat plate antenna, is a third frequency that is higher than the first resonance frequency, the second resonance frequency, and the third resonance frequency.

7. The power module according to claim 2, wherein one or both of the first electrically conductive metal pattern and the second electrically conductive metal pattern each have two or more through holes on a perpendicular drawn downward, to a shortest connection path between the two adjacent semiconductor elements, from a location at which the capacitive element is connected to the first electrically conductive metal pattern or the second electrically conductive metal pattern.

8. The power module according to claim 2, wherein
each of the two adjacent semiconductor elements and the capacitive element located at the vertices of the triangle has a rectangular shape,
the capacitive element is disposed such that one long side thereof faces one long side of each of the two adjacent semiconductor elements,
one or both of the first electrically conductive metal pattern and the second electrically conductive metal pattern each have a through hole between the capacitive element and the two adjacent semiconductor elements, and
a value obtained by subtracting a first distance from a first length is equal to or larger than ½ a second length of a short side of the capacitive element where:
the first length is associated with a portion of a perpendicular, from an outer periphery of the capacitive element to a line segment which connects a first corner, of one semiconductor element located closer to the capacitive element out of the two adjacent semiconductor elements, that is closest to the capacitive element to a second corner that is an end, of a long side of another one of the semiconductor elements facing the capacitive element, that is farther from the capacitive element, the perpendicular being drawn downward to the line segment from a center of a location at which the capacitive element is connected to the first electrically conductive metal pattern or the second electrically conductive metal pattern; and
the first distance is between two perpendiculars drawn downward to the perpendicular from circumferential portions, of the through hole, that are farthest from each other as viewed in a direction of the perpendicular.

* * * * *